(12) United States Patent
Wang

(10) Patent No.: US 9,811,611 B2
(45) Date of Patent: Nov. 7, 2017

(54) METHOD AND APPARATUS FOR CREATING CURVED SURFACE MODEL

(71) Applicant: Huawei Technologies Co., Ltd., Shenzhen (CN)

(72) Inventor: Kai Wang, Beijing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 278 days.

(21) Appl. No.: 14/751,776

(22) Filed: Jun. 26, 2015

(65) Prior Publication Data

US 2015/0379163 A1    Dec. 31, 2015

(30) Foreign Application Priority Data

Jun. 27, 2014  (CN) .......................... 2014 1 0301820

(51) Int. Cl.
  *G06T 19/20*   (2011.01)
  *G06F 17/10*   (2006.01)
  *G06F 17/50*   (2006.01)
  *G06T 17/00*   (2006.01)

(52) U.S. Cl.
  CPC ............ *G06F 17/50* (2013.01); *G06F 17/10* (2013.01); *G06T 17/00* (2013.01); *G06T 19/20* (2013.01); *G06T 2219/2021* (2013.01)

(58) Field of Classification Search
  None
  See application file for complete search history.

(56) References Cited

U.S. PATENT DOCUMENTS 5,739,822 A * 4/1998 Paradine ................. G06T 17/20
                                                     345/419
2003/0122816 A1  7/2003 Yu et al.
2010/0008566 A1  1/2010 Lin et al.

FOREIGN PATENT DOCUMENTS

CN       1422727 A    6/2003
CN     101799936 A    8/2010
CN     102486809 A    6/2012
(Continued)

OTHER PUBLICATIONS

Treece et al. "Fast surface and volume estimation from non-parallel cross-sections,for freehand three-dimensional ultrasound" 1999, Medical Image Analysis (1999) vol. 3, No. 2, pp. 141-173, Oxford University process.*

(Continued)

*Primary Examiner* — Kee M Tung
*Assistant Examiner* — Yanna Wu
(74) *Attorney, Agent, or Firm* — Conley Rose, P.C.

(57) ABSTRACT

A method and an apparatus for creating a curved surface model are provided, where the method includes acquiring an already input section line of a target object; dividing three-dimensional space into zones by using a plane on which the already input section line of the target object is located; generating, according to a shape of each zone and a section line included in each zone, a geometry located within each zone, where the section line included in each zone is interpolated into the surface of the geometry, and extracting the surface of the geometry located within each zone to generate a sub-curved surface located within each zone, where a section line included in the zone is interpolated into the sub-curved surface; and splicing the sub-curved surfaces to obtain a curved surface model of the target object.

24 Claims, 11 Drawing Sheets

(56) References Cited

FOREIGN PATENT DOCUMENTS

| CN | 102760309 A | 10/2012 |
|---|---|---|
| CN | 103295262 A | 9/2013 |

OTHER PUBLICATIONS

Minardi, L., et al., "Cad Turns to Surface Modeling," 903 Machine Design, vol. 55, No. 27, Nov. 1983, 6 pages.
"3D modelling for CAD/CAM, Part 1," vol. 223, No. 12, Dec. 1983, 4 pages.
Olsen, L, et al., "Sketch-based modeling: A survey," Computers & Graphics 33, 2009, pp. 85-103.
Kunjin, H., et al., "Creation of user-defined freeform feature from surface models based on characteristic curves," Computers in Industry 65, 2014, pp. 598-609.
Foreign Communication From a Counterpart Application, European Application No. 15173746.7, Extended European Search Report dated Feb. 10, 2016, 9 pages.
Partial English Translation and Abstract of Chinese Patent Application No. CN1422727, Oct. 10, 2015, 3 pages.
Partial English Translation and Abstract of Chinese Patent Application No. CN101799936, Oct. 10, 2015, 6 pages.
Partial English Translation and Abstract of Chinese Patent Application No. CN102486809, Oct. 10, 2015, 3 pages.
Partial English Translation and Abstract of Chinese Patent Application No. CN102760309, Oct. 10, 2015, 30 pages.
Partial English Translation and Abstract of Chinese Patent Application No. CN103295262, Oct. 10, 2015, 5 pages.
Werahera, P., et al., " A 3-D Reconstruction Algorithm for Interpolation and Extrapolation of Planar Cross Sectional Data," IEEE Transactions on Medical Imaging, vol. 14, No. 4, Dec. 1995, pp. 765-771.
Ju, T., et al., "Building 3D surface networks from 2D curve networks with application to anatomical modeling," The Visual Computer, 2005, 9 pages.
Herman, G., et al., "Shape-based Interpolation," May 1992, pp. 69-79.
Raya, S., et al., "Shape-Based Interpolation of Multidimensional Objects," IEEE Transactions on Medical Imaging, vol. 9, No. 1, Mar. 1990, pp. 32-42.
Liu, L., et al., "Surface Reconstruction From Non-Parallel Curve Networks," Eurographics, vol. 27, No. 2, 2008, 9 pages.
Edwards, J., et al., "Topologically correct reconstruction of tortuous contour forests," ACM Symposium of Solid and Physical Modeling, 2010, pp. 52-61.

\* cited by examiner

METHOD AND APPARATUS FOR CREATING CURVED SURFACE MODEL

CROSS-REFERENCE TO RELATED APPLICATION

This application claims priority to Chinese Patent Application No. 201410301820.4, filed on Jun. 27, 2014, which is hereby incorporated by reference in its entirety.

TECHNICAL FIELD

Embodiments of the present invention relate to the field of graphics processing technologies, and in particular, to a method and an apparatus for creating a curved surface model.

BACKGROUND

Curved surface modeling is widely applied in many fields such as computer graphics and computer-aided design, for example, to air gesture-based three-dimensional (3D) model creation, medical data-based 3D model recreation, and terrain reconstruction in augmented reality. For this problem, input is a series of closed plane curves, which are manually input by a user or extracted from a scanned two-dimensional (2D) slice, and output is a smooth curved surface into which the input curves are interpolated.

With the development of related technologies and the popularity of interactive applications, section line-based dynamic curved surface creation is becoming a new demand of people. The dynamic curved surface creation refers to outputting a series of curved surfaces along with a series of dynamically input section lines, where a currently input section line should be interpolated into each curved. The dynamic curved surface creation may provide a real-time feedback to a user as input data changes, so that the user better learns a current creation result, and provide a reference for data input in a next step. For example, during creation of an ultrasonic data-based 3D medical model, when a doctor uses a handheld device (such as an ultrasonic scanner) to scan a body of a patient, a 3D organic model created in real time may be obtained by using a dynamic curved surface creation technology, and the doctor can adjust a scanning location and direction according to a real-time creation result to obtain a complete model creation result of an organ of interest.

A currently existing dynamic curved surface creation solution generally needs to depend on an axial plane set of each zone. That is, 3D space is divided into several zones according to a plane on which all currently input section lines are located. The axial plane set of each zone is calculated; section lines on each plane of a zone are projected onto an axial plane set of the zone; the section lines and the projection on the axial plane set are connected, to form one geometry; then, surfaces of all geometries are extracted and spliced together to form a sub-curved surface of the zone; sub-curved surfaces of all the zones are connected to form a final curved surface model.

A creation result of the foregoing method depends heavily on calculation of the axial plane set of each zone. In a dynamic recreation process, because input of a new section line may cause a change in a shape of a zone obtained after the division, and the change in the shape of the zone obtained after the division may cause a great change in the axial plane set, and therefore, an unnatural and unpredictable change is caused in a dynamic recreation result; in addition, when the shape of the zone obtained after the division is relatively complex, a shape of a calculated axial plane is also relatively complex, thereby causing that some local topological noises are included in the creation result and reducing topological quality of a recreated curved surface.

SUMMARY

In view of this, embodiments of the present invention provide a method and an apparatus for creating a curved surface model, which can prevent local topological noises, thereby improving topological quality of the curved surface model.

A first aspect of the embodiments of the present invention provides a method for creating a curved surface model, including acquiring an already input section line of a target object; dividing three-dimensional space into zones by using a plane on which the already input section line of the target object is located; generating, according to a shape of each zone and a section line included in each zone, a geometry located within each zone, where the section line included in each zone is interpolated into the surface of the geometry, and extracting the surface of the geometry located within each zone to generate a sub-curved surface located within each zone, where a section line included in the zone is interpolated into the sub-curved surface; and splicing the sub-curved surfaces to obtain a curved surface model of the target object.

With reference to the first aspect of the embodiments of the present invention, in a first implementation manner of the first aspect of the embodiments of the present invention, after the dividing three-dimensional space into zones by using a plane on which the already input section line of the target object is located, the method further includes determining a type of each zone, so as to process zones of a same type by using a same processing method, where the determining a type of each zone is that if the section lines are included on two or more planes in all planes constituting a zone, determining that the zone is a body zone; if a section line is included on only one plane in all planes constituting a zone, determining that the zone is an end zone; and if a section line is not included on any plane in all planes constituting a zone, determining that the zone is an empty zone.

With reference to the first implementation manner of the first aspect of the embodiments of the present invention, in a second implementation manner of the first aspect of the embodiments of the present invention, the processing zones of a same type by using a same processing method includes, for the body zone, selecting any plane including a section line from the body zone, using a zone enclosed by the section line within the plane as a bottom surface, and translating the bottom surface in a direction perpendicular to the bottom surface to generate a geometry whose top surface is in a same shape as the bottom surface, where the section line is interpolated into the surface of the geometry, a height of the geometry is $h_p = \delta * h_{ij}$, where $\delta \in (0,1)$, and $h_{ij}$ is a shortest distance between a center of the section line and a point at which a ray starting with the center of the section line and emitted in the direction perpendicular to the bottom surface intersects with another plane constituting the body zone; for another section line included in the body zone, generating, according to the foregoing method, a geometry into which the another section line is interpolated; processing a geometry that is beyond the body zone, so that all geometries are located within the body zone; and solving a union set of all the geometries located within the body zone, extracting a surface of the union set, and using the surface as a sub-curved surface located within the body zone, where a section line included in the body zone is interpolated into the sub-curved surface.

With reference to the second implementation manner of the first aspect of the embodiments of the present invention, in a third implementation manner of the first aspect of the embodiments of the present invention, the body zone includes at least a first section line and a second section line, the generated geometry located within the body zone includes at least a first geometry and a second geometry, the first section line is interpolated into a surface of the first geometry, and the second section line is interpolated into a surface of the second geometry, and the processing a geometry that is beyond the body zone, so that all geometries are located within the body zone includes: when the first section line does not intersect with the second section line, and the first geometry and/or the second geometry are/is beyond the body zone, decreasing a value of $\delta$ of the first geometry and/or a value of $\delta$ of the second geometry to adjust a height $h_p$ of the first geometry and/or a height $h_p$ of the second geometry, so that the first geometry and/or the second geometry are/is located within the body zone; and/or moving all points on a contour line of a top surface of the first geometry and/or the second geometry towards a center of the top surface until all the points on the contour line of the top surface are located within the body zone.

With reference to the second implementation manner of the first aspect of the embodiments of the present invention, in a fourth implementation manner of the first aspect of the embodiments of the present invention, the body zone includes at least a first section line and a second section line, the generated geometry located within the body zone includes at least a first geometry and a second geometry, the first section line is interpolated into a surface of the first geometry, and the second section line is interpolated into a surface of the second geometry, and when the first section line intersects with the second section line, a point that is on a contour line of a top surface of the generated first geometry and is corresponding to a point preset on the first section line is located within the body zone, and the point preset on the first section line is a point at a distance shorter than a first distance threshold from a plane on which the second section line is located.

With reference to the fourth implementation manner of the first aspect of the embodiments of the present invention, in a fifth implementation manner of the first aspect of the embodiments of the present invention, the processing a geometry that is beyond the body zone, so that all geometries are located within the body zone includes the following.

Step 1: Move a point that is on the contour line of the top surface of the first geometry and is beyond the body zone into the body zone; and Step 2: Perform transformation on a contour line, obtained after the moving, of the top surface of the first geometry by using a curve smoothing algorithm, and in a transformation process, retain a point that is on the contour line, obtained after the moving, of the top surface and is at a distance shorter than a second distance threshold from the another plane constituting the body zone; where when it is determined that there is still a point that is beyond the body zone on the transformed contour line of the top surface of the first geometry, step 1 and step 2 are repeated until all points on the transformed contour line of the top surface of the first geometry are located within the body zone; and/or when the second geometry is beyond the body zone, the second geometry is processed by using a processing method that is the same as that for the first geometry.

With reference to the fifth implementation manner of the first aspect of the embodiments of the present invention, in a sixth implementation manner of the first aspect of the embodiments of the present invention, the first geometry intersects with the second geometry, and an intersecting part is a three-dimensional zone.

With reference to the first implementation manner of the first aspect of the embodiments of the present invention, in a seventh implementation manner of the first aspect of the embodiments of the present invention, the processing zones of a same type by using a same processing method includes, for the end zone, using a zone enclosed by a section line of the end zone as a bottom surface, projecting the bottom surface in a direction perpendicular to the bottom surface onto another plane constituting the end zone, and finding a plane with a largest projection area; and projecting the bottom surface in a direction perpendicular to the plane with the largest projection area to obtain a projection contour line that is formed on the plane with the largest projection area by the bottom surface, connecting the projection contour line to the bottom surface to form a third geometry, and extracting a surface of the third geometry to generate a sub-curved surface located within the end zone, where the section line comprised in the zone is interpolated into the sub-curved surface; and for the empty zone, skipping performing processing.

With reference to the seventh implementation manner of the first aspect of the embodiments of the present invention, in an eighth implementation manner of the first aspect of the embodiments of the present invention, after the connecting the projection contour line to the bottom surface to form a third geometry, the method further includes extending the third geometry to the body zone and/or another end zone, so that the third geometry intersects with a geometry within the body zone and/or the another end zone.

With reference to the first aspect of the embodiments of the present invention, or the first, the second, the third, the fourth, the fifth, the sixth, the seventh, or the eighth implementation manner of the first aspect, in a ninth implementation manner of the first aspect of the embodiments of the present invention, the method further includes acquiring a newly input section line of the target object; redividing the three-dimensional space into zones by using a plane on which the newly input section line of the target object is located; for a zone affected by the newly input section line of the target object, regenerating a sub-curved surface located within the affected zone, where a section line included in the affected zone is interpolated into the sub-curved surface; and splicing sub-curved surfaces within all zones to obtain an updated curved surface model of the target object.

With reference to the first aspect of the embodiments of the present invention or the first implementation manner of the first aspect, in a tenth implementation manner of the first aspect of the embodiments of the present invention, the section line is a closed plane curve, and two section lines located on a same plane do not intersect.

With reference to the first aspect of the embodiments of the present invention or the first implementation manner of the first aspect, in an eleventh implementation manner of the first aspect of the embodiments of the present invention, for a first section line and a second section line that are respectively located on any two non-parallel planes, namely, a first plane and a second plane, an intersection point set of the first section line and the second plane is consistent with an intersection point set of the second section line and the first plane.

With reference to the first aspect of the embodiments of the present invention, or the first, the second, the third, the fourth, the fifth, the sixth, the seventh, or the eighth implementation manner of the first aspect, in a twelfth implementation manner of the first aspect of the embodiments of the present invention, the curved surface model of the target object is a subdivision curved surface model or a triangle mesh curved surface model.

A second aspect of the embodiments of the present invention provides an apparatus for creating a curved surface model, including an acquiring unit configured to acquire an already input section line of a target object; a zone dividing unit configured to divide three-dimensional space into zones by using a plane on which the already input section line of the target object is located; a processing unit configured to generate, according to a shape of each zone and a section line included in each zone, a geometry located within each zone, where the section line comprised in each zone is interpolated into the surface of the geometry, and extract the surface of the geometry located within each zone to generate a sub-curved surface located within each zone, where a section line included in the zone is interpolated into the sub-curved surface; and a splicing unit configured to splice the sub-curved surfaces to obtain a curved surface model of the target object.

With reference to the second aspect of the embodiments of the present invention, in a first implementation manner of the second aspect of the embodiments of the present invention, the apparatus further includes a determining unit configured to determine a type of each zone after the zone dividing unit divides the three-dimensional space into zones, so that the processing unit processes zones of a same type by using a same processing method, where that the determining unit determines the type of each zone includes that, when the section lines are included on two or more planes in all planes constituting a zone, the determining unit determines that the zone is a body zone; when a section line is included on only one plane in all planes constituting a zone, the determining unit determines that the zone is an end zone; and when a section line is not included on any plane in all planes constituting a zone, the determining unit determines that the zone is an empty zone.

With reference to the first implementation manner of the second aspect of the embodiments of the present invention, in a second implementation manner of the second aspect of the embodiments of the present invention, when processing the body zone, the processing unit includes a geometry generating unit configured to select any plane including a section line from the body zone, use a zone enclosed by the section line within the plane as a bottom surface, and translate the bottom surface in a direction perpendicular to the bottom surface to generate a geometry whose top surface is in a same shape as the bottom surface, where the section line is interpolated into the surface of the geometry, a height of the geometry is $h_p=\delta*h_{ij}$, wherein $\delta \in (0,1)$, and $h_{ij}$ is a shortest distance between a center of the section line and a point at which a ray starting with the center of the section line and emitted in the direction perpendicular to the bottom surface intersects with another plane constituting the body zone; where the geometry generating unit is further configured to, for another section line included in the body zone, successively generate a geometry into which the another section line is interpolated; a body processing unit configured to process a geometry that is beyond the body zone, so that all geometries are located within the body zone; and a first sub-curved surface generating unit configured to solve a union set of all the geometries located within the body zone, extract a surface of the union set, and use the surface as a sub-curved surface located within the body zone, where a section line included in the body zone is interpolated into the sub-curved surface.

With reference to the second implementation manner of the second aspect of the embodiments of the present invention, in a third implementation manner of the second aspect of the embodiments of the present invention, the body zone includes at least a first section line and a second section line, the geometry that is generated by the geometry generating unit and located within the body zone includes at least a first geometry and a second geometry, the first section line is interpolated into a surface of the first geometry, the second section line is interpolated into a surface of the second geometry, and the first section line does not intersect with the second section line; the body processing unit includes a first processing subunit configured to, when the first geometry and/or the second geometry are/is beyond the body zone, decrease a value of $\delta$ of the first geometry and/or a value of $\delta$ of the second geometry to adjust a height $h_p$ of the first geometry and/or a height $h_p$ of the second geometry, so that the first geometry and/or the second geometry are/is located within the body zone; and/or a second processing subunit configured to move all points on a contour line of a top surface of the first geometry and/or the second geometry towards a center of the top surface until all the points on the contour line of the top surface are located within the body zone.

With reference to the second implementation manner of the second aspect of the embodiments of the present invention, in a fourth implementation manner of the second aspect of the embodiments of the present invention, the body zone includes at least a first section line and a second section line, the geometry that is generated by the geometry generating unit and located within the body zone includes at least a first geometry and a second geometry, the first section line is interpolated into a surface of the first geometry, and the second section line is interpolated into a surface of the second geometry, the first section line intersects with the second section line, a point that is on a contour line of a top surface of the first geometry generated by the geometry generating unit and is corresponding to a point preset on the first section line is located within the body zone, and the point preset on the first section line is a point at a distance shorter than a first distance threshold from a plane on which the second section line is located.

With reference to the fourth implementation manner of the second aspect of the embodiments of the present invention, in a fifth implementation manner of the second aspect of the embodiments of the present invention, the body processing unit includes a third processing subunit configured to move a point that is on the contour line of the top surface of the first geometry and is beyond the body zone into the body zone; a fourth processing subunit configured to perform transformation on a contour line, obtained after the moving, of the top surface of the first geometry by using a curve smoothing algorithm, and in a transformation process, retain a point that is on the contour line, obtained after the moving, of the top surface and is at a distance shorter than a second distance threshold from the another plane constituting the body zone; and a determining subunit configured to, after it is determined that there is still a point that is beyond the body zone on the transformed contour line of the top surface of the first geometry, trigger the third processing subunit and the fourth processing subunit to continue processing the first geometry until all points on the transformed contour line of the top surface of the first geometry are located within the body zone; where the third processing subunit and the fourth processing subunit are further configured to, when the second geometry is beyond the body zone, process the second geometry by using a processing method that is the same as that for the first geometry.

With reference to the fifth implementation manner of the second aspect of the embodiments of the present invention, in a sixth implementation manner of the second aspect of the embodiments of the present invention, the first geometry intersects with the second geometry, and an intersecting part is a three-dimensional zone.

With reference to the first implementation manner of the second aspect of the embodiments of the present invention, in a seventh implementation manner of the second aspect of the embodiments of the present invention, when processing the end zone, the processing unit includes a projection processing unit configured to use a zone enclosed by a section line of the end zone as a bottom surface, project the bottom surface in a direction perpendicular to the bottom surface onto another plane constituting the end zone, and find a plane with a largest projection area; project the bottom surface in a direction perpendicular to the plane with the largest projection area to obtain a projection contour line that is formed on the plane with the largest projection area by the bottom surface; an end processing unit configured to connect the projection contour line to the bottom surface to form a third geometry; and a second sub-curved surface generating unit configured to extract a surface of the third geometry to generate a sub-curved surface located within the end zone, where the section line included in the zone is interpolated into the sub-curved surface; and for the empty zone, the processing unit skips performing processing.

With reference to the seventh implementation manner of the second aspect of the embodiments of the present invention, in an eighth implementation manner of the second aspect of the embodiments of the present invention, the end processing unit is further configured to, after connecting the projection contour line to the bottom surface to form the third geometry, extend the third geometry to the body zone and/or another end zone, so that the third geometry intersects with a geometry within the body zone and/or the another end zone.

With reference to the second aspect of the embodiments of the present invention, or the first, the second, the third, the fourth, the fifth, the sixth, the seventh, or the eighth implementation manner of the second aspect, in a ninth implementation manner of the second aspect of the embodiments of the present invention, the acquiring unit is further configured to acquire a newly input section line of the target object; the zone dividing unit is further configured to redivide the three-dimensional space into zones by using a plane on which the newly input section line of the target object is located; the processing unit is further configured to, for a zone affected by the newly input section line of the target object, regenerate a sub-curved surface located within the affected zone, where a section line included in the affected zone is interpolated into the sub-curved surface; and the splicing unit is further configured to splice sub-curved surfaces within all zones to obtain an updated curved surface model of the target object.

With reference to the second aspect of the embodiments of the present invention or the first implementation manner of the second aspect, in a tenth implementation manner of the second aspect of the embodiments of the present invention, the section line is a closed plane curve, and two section lines located on a same plane do not intersect.

With reference to the second aspect of the embodiments of the present invention or the first implementation manner of the second aspect, in an eleventh implementation manner of the second aspect of the embodiments of the present invention, for a first section line and a second section line that are respectively located on any two non-parallel planes, namely, a first plane and a second plane, an intersection point set of the first section line and the second plane is consistent with an intersection point set of the second section line and the first plane.

With reference to the second aspect of the embodiments of the present invention, or the first, the second, the third, the fourth, the fifth, the sixth, the seventh, or the eighth implementation manner of the second aspect, in a twelfth implementation manner of the second aspect of the embodiments of the present invention, the curved surface model of the target object is a subdivision curved surface model or a triangle mesh curved surface model.

It can be seen from the foregoing technical solutions that, the embodiments of the present invention have the following advantages.

In the embodiments of the present invention, after three-dimensional space is divided into zones, a geometry located within each zone is generated directly according to a shape of each zone and a section line included in each zone, where a section line included in each zone is interpolated into the surface of the geometry, that is, creation of the geometry of each zone does not need to depend on an axial plane set of each zone, so that local topological noises are prevented, and topological quality of a curved surface model is improved.

BRIEF DESCRIPTION OF DRAWINGS

To describe the technical solutions in the embodiments of the present invention more clearly, the following briefly introduces the accompanying drawings required for describing the embodiments. The accompanying drawings in the following description show merely some embodiments of the present invention, and a person of ordinary skill in the art may still derive other drawings from these accompanying drawings without creative efforts.

DESCRIPTION OF EMBODIMENTS

The following describes the technical solutions in the embodiments of the present invention with reference to the accompanying drawings in the embodiments of the present invention. The described embodiments are merely a part rather than all of the embodiments of the present invention. All other embodiments obtained by a person of ordinary skill in the art based on the embodiments of the present invention without creative efforts shall fall within the protection scope of the present invention.

The embodiments of the present invention provide a method and an apparatus for creating a curved surface model, which can prevent local topological noises, thereby improving topological quality of the curved surface model.

Figure 1:
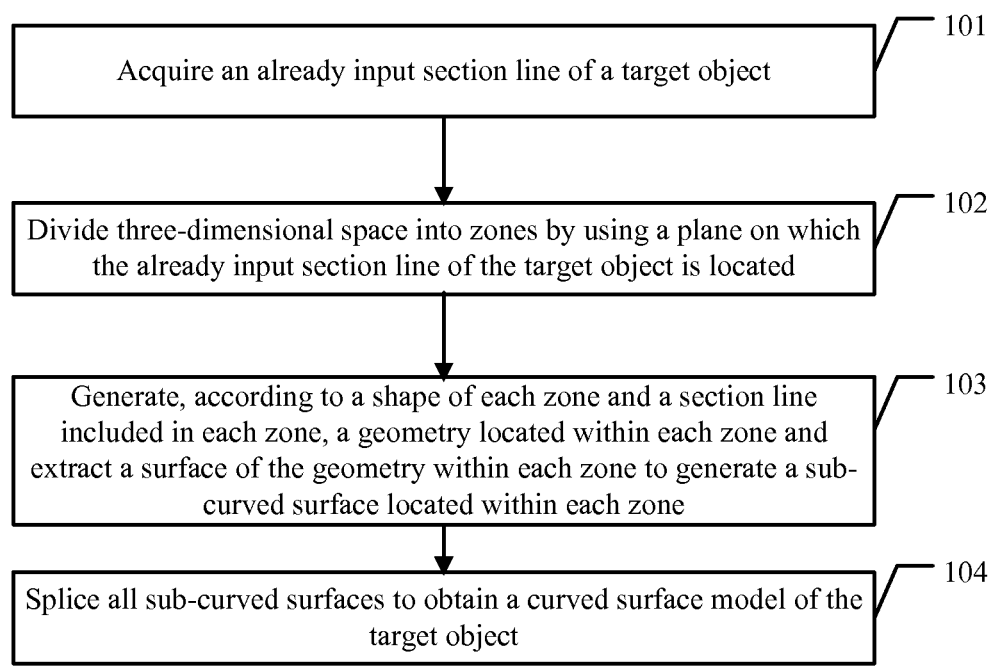
FIG. 1 is a schematic diagram of an embodiment of a method for creating a curved surface model according to the present invention.

Referring to FIG. 1 below, FIG. 1 is a schematic diagram of an embodiment of a method for creating a curved surface model according to the present invention. The method for creating a curved surface model in this embodiment includes the following.

101. Acquire an already input section line of a target object.

102. Divide three-dimensional space into zones by using a plane on which the already input section line of the target object is located.

103. Generate, according to a shape of each zone and a section line included in each zone, a geometry located within each zone, where the section line included in each zone is interpolated into the surface of the geometry, and extract the surface of the geometry located within each zone to generate a sub-curved surface located within each zone, where a section line included in the zone is interpolated into the sub-curved surface.

104. Splice all sub-curved surfaces to obtain a curved surface model of the target object.

For ease of understanding, the following describes the method for creating a curved surface model provided in this embodiment.

The section line of the target object mentioned in this embodiment is a closed plane curve, and two section lines located on a same plane do not intersect; for a section line a and a section line b that are respectively located on any two non-parallel planes, namely, a plane i and a plane j, an intersection point set of the section line a and the plane j is consistent with an intersection point set of the section line b and the plane i, thereby ensuring that the established curved surface model is effective.

After the three-dimensional space is divided into zones by using the plane on which the already input section line of the target object is located, a type of each zone may be further determined, where each zone is a closed spatial zone constituted by planes in different directions, and one section line may be included within one or more closed zones. A specific method for determining the type of each zone may be as follows, if section lines are included on two or more planes in all planes constituting a zone, determining that the zone is a body zone; if a section line is included on only one plane in all planes constituting a zone, determining that the zone is an end zone; and if no section line is included on any plane in all planes constituting a zone, determining that the zone is an empty zone.

Next, zones of a same type are processed by using a same processing method.

For the body zone, section lines are included on two or more planes in the body zone, and the section lines included on the two or more planes may intersect or may not intersect, which are separately described below.

First, referring to FIG. 2A to FIG. 2D, FIG. 2A to FIG. 2D describe a process of generating, when the section lines included on the two or more planes in the body zone do not intersect, a sub-curved surface that is located within the body zone, where the section lines included in the body zone are interpolated into the sub-curved surface.

Figure 2A:
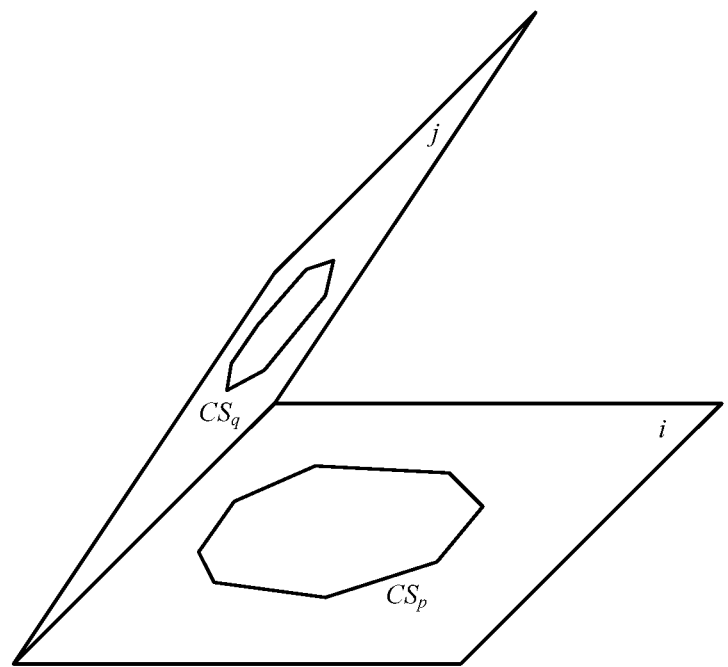
FIG. 2A to FIG. 2D are schematic diagrams of an embodiment of a method for generating a sub-curved surface within a body zone.
Figure 2B:
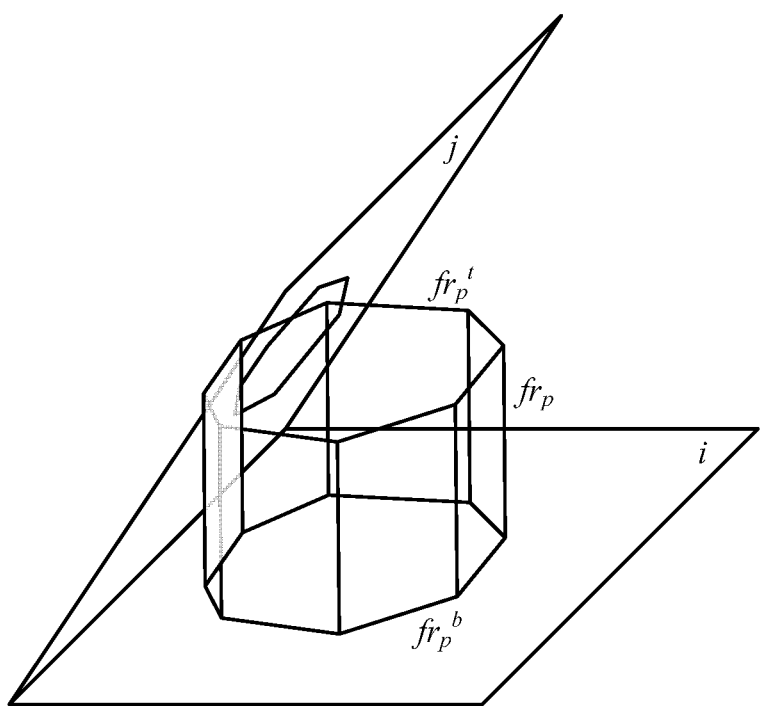

As shown in FIG. 2A, section lines $Cs_p$ and $Cs_q$ are respectively included on a plane i and a plane j within a body zone, and $Cs_p$ and $Cs_q$ do not intersect. First, the plane i is selected. A zone enclosed by the section line $Cs_p$ included on the plane i is used as a bottom surface $fr_p^b$. The bottom surface $fr_p^b$ is translated in a direction perpendicular to the bottom surface $fr_p^b$ to establish a geometry $fr_p$ whose top surface $fr_p^t$ is in a same shape as the bottom surface $fr_p^b$, where the section line $Cs_p$ is interpolated into the surface of the geometry $fr_p$. A height (that is, a translation distance) of the geometry is $h_p=\delta*h_{ij}$, where $\delta\in(0,1)$, and $h_{ij}$ is a shortest distance between a center of the section line $Cs_p$ and a point at which a ray starting with the center of the section line $Cs_p$ and emitted in the direction perpendicular to the bottom surface $fr_p^b$ intersects with another plane constituting the body zone. The established geometry $fr_p$ is shown in FIG. 2B.

After establishment of the geometry $fr_p$ including the section line $Cs_p$ is complete, the geometry $fr_p$ may be beyond the body zone. If the geometry $fr_p$ is beyond the body zone, the geometry $fr_p$ needs to be processed, so that the geometry $fr_p$ is located within the body zone. A specific processing method may be as follows: moving all points on a contour line of the top surface $fr_p^t$ of the geometry $fr_p$ towards a center of the top surface $fr_p^t$ until all the points on the contour line of the top surface $fr_p^t$ are located within the body zone, or decreasing $\delta$ to reduce the height of the geometry $fr_p$, so that all points on a contour line of the top surface $fr_p^t$ of the geometry $fr_p$ are located within the body zone.

Figure 2C:
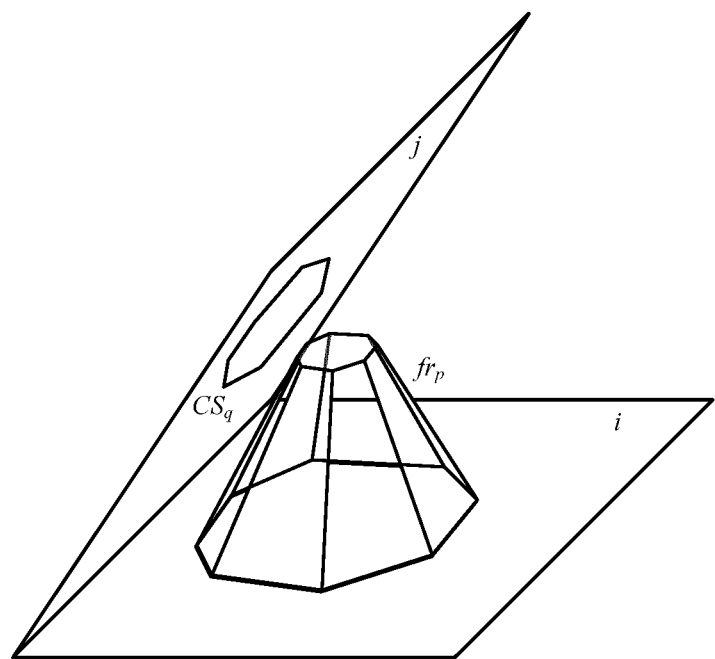

In addition, the foregoing two methods may also be combined, that is, all points on a contour line of the top surface $fr_p^t$ of the geometry $fr_p$ are first moved towards a center of the top surface $fr_p^t$, and when a ratio of a moving distance to an initial distance from the center of the top surface $fr_p^t$ reaches a preset threshold, the height of the geometry $fr_p$ is reduced, so that all the points on the contour line of the top surface $fr_p^t$ of the geometry $fr_p$ are located within the body zone. The processed geometry $fr_p$ is shown in FIG. 2C.

Figure 2D:
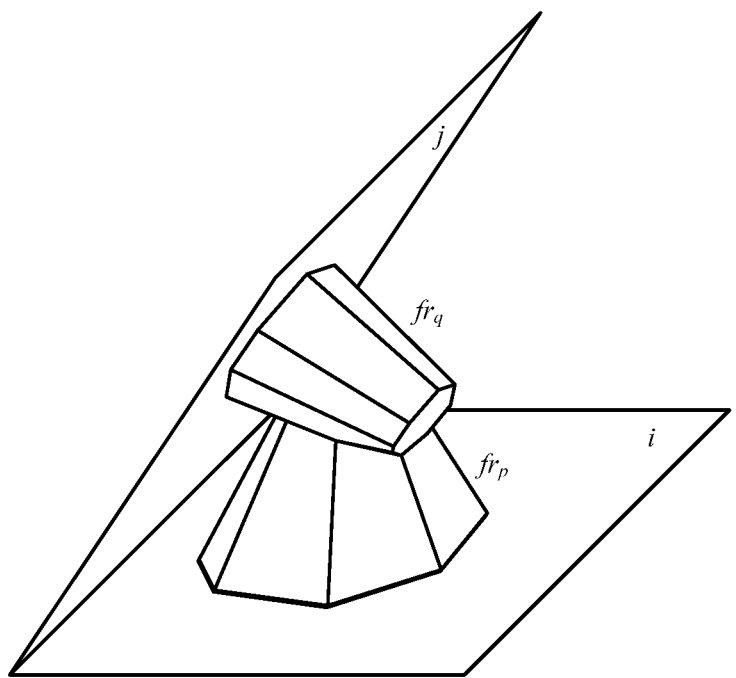

Next, a geometry $fr_q$ is generated according to a processing method that is the same as that for the geometry $fr_p$, where the section line $Cs_q$ is interpolated into the surface of the geometry $fr_q$, and a union of the geometries $fr_p$ and $fr_q$ is calculated. A calculation formula is $$u_x = \bigcup_{y=1}^{n} fr_{xy},$$

where $\cup$ is a union operator, $fr_{xy}$ represents the yth geometry in a zone x, n is a total quantity of geometries in the zone x, and $u_x$ is a union of the geometries in the zone x. After the union $u_x$ of the geometries are obtained by means of calculation, a surface of $u_x$ is extracted and used as the sub-curved surface generated within the body zone. The sub-curved surface within the body zone is shown in FIG. 2D.

Referring to FIG. 3A to FIG. 3D below, FIG. 3A to FIG. 3D describe a process of generating, when the section lines included on the two or more planes in the body zone intersect, a sub-curved surface that is located within the body zone, where the section lines included in the body zone are interpolated into the sub-curved surface.

Figure 3A:
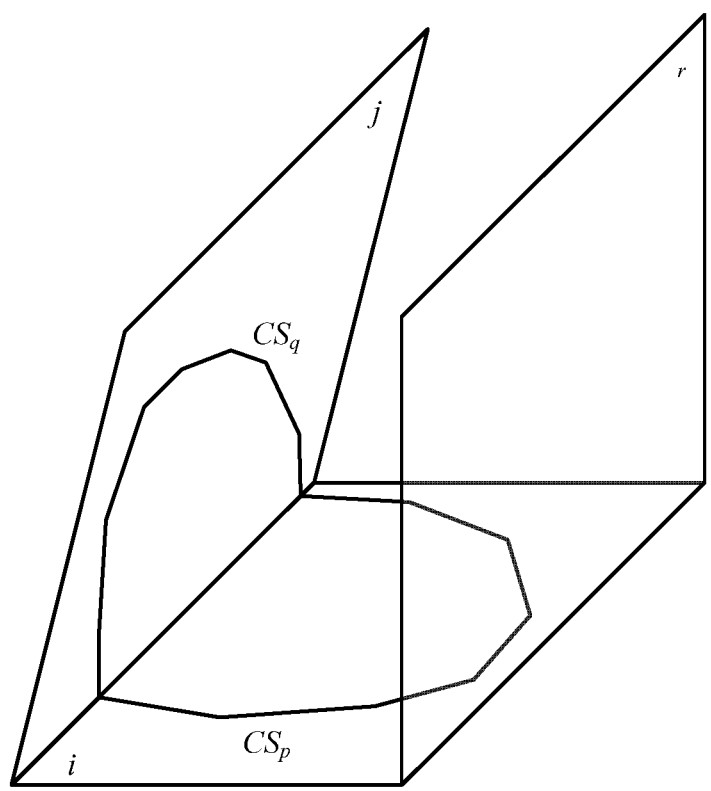
FIG. 3A to FIG. 3D are schematic diagrams of another embodiment of a method for generating a sub-curved surface within a body zone.

As shown in FIG. 3A, a plane i, a plane j, and a plane r are included within a body zone, section lines $Cs_p$ and $Cs_q$ are respectively included on the plane i and the plane j, and $Cs_p$ intersects with $Cs_q$. First, the plane i is selected. A zone enclosed by the section line $Cs_p$ included on the plane i is used as a bottom surface $fr_p^b$. The bottom surface $fr_p^b$ is translated in a direction perpendicular to the bottom surface $fr_p^b$ to establish a geometry $fr_p$ whose top surface $fr_p^t$ is in a same shape as the bottom surface $fr_p^b$, where the section line $Cs_p$ is interpolated into the surface of the geometry $fr_p$. A height (that is, a translation distance) of the geometry is $h_p = \delta * h_{ij}$, where $\delta \in (0,1)$, and $h_{ij}$ is a shortest distance between a center of the section line $Cs_p$ and a point at which a ray starting with the center of the section line $Cs_p$ and emitted in the direction perpendicular to the bottom surface $fr_p^b$ intersects with another plane constituting the body zone. The established geometry $fr_p$ is shown in FIG. 3B.

Figure 3B:
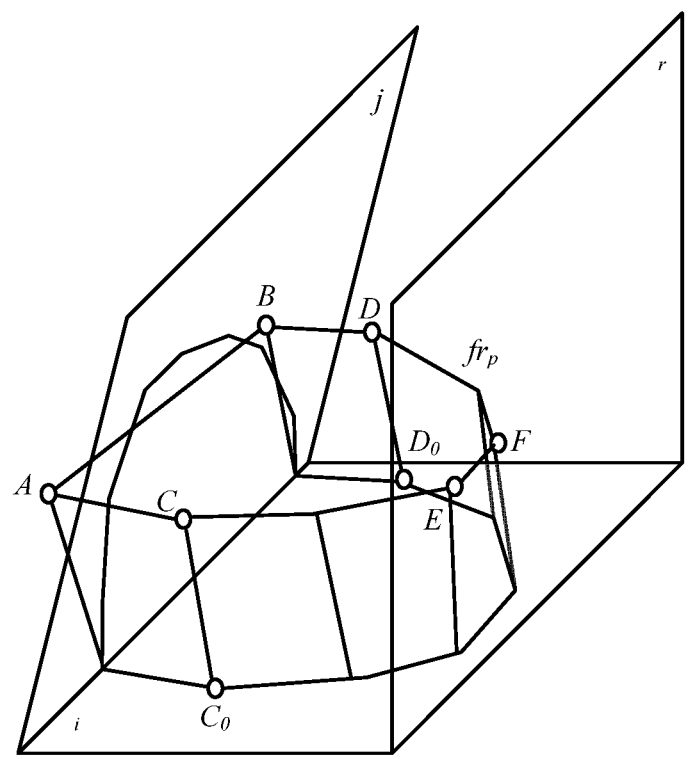

In FIG. 3B, points A and B are points that are beyond the body zone; points $C_0$ and $D_0$ are points that are on the section line $Cs_p$ and are at a distance shorter than a first distance threshold from the plane j on which the section line $Cs_q$ is located, points C and D are points that are on the top surface $fr_p^t$ of the geometry $fr_p$ and are corresponding to locations of $C_0$ and $D_0$, and the points C and D belong to a point set $PT_f$; points E and F are points that are on a contour line of the top surface $fr_p^t$ of the geometry $fr_p$ and are at a distance shorter than a second distance threshold from the plane r, and the points E and F belong to a point set $PT_0$. The first distance threshold and the second distance threshold may be preset according to actual needs.

When the section lines $Cs_p$ and $Cs_q$ intersect, to ensure that the points C and D on the top surface $fr_p^t$ of the established geometry $fr_p$ are located within the body zone, the height of the geometry $fr_p$ may be adjusted herein for implementation. This restriction is for ensuring that a union of the geometry $fr_p$ and a subsequently established geometry $fr_q$ into the section line $Cs_q$ is interpolated is a geometry with a manifold surface.

It can be seen from FIG. 3B that, because the established geometry $fr_p$ is beyond the body zone, the geometry $fr_p$ needs to be processed, so that the geometry $fr_p$ is located within the body zone. A specific processing method may be as follows: first, moving points (such as points A and B) that are on the contour line of the top surface $fr_p^t$ of the geometry $fr_p$ and are beyond the body zone towards a center of the top surface $fr_p^t$ until all points on the contour line of the top surface $fr_p^t$ are located within the body zone; next, performing transformation on a contour line $PT_b$, obtained after the moving, of the top surface $fr_p^t$ of the geometry $fr_p$ by using a curve smoothing algorithm, and in a transformation process, retaining a point $PT_0$ (such as a point E or F) that is on the contour line $PT_b$, obtained after the moving, of the top surface $fr_p^t$ and is at a distance shorter than the second distance threshold from the another plane constituting the body zone. An objective for performing transformation on the contour line $PT_b$ of the top surface $fr_p^t$ of the geometry $fr_p$ is to prevent previous moving of the points that are on the contour line of the top surface $fr_p^t$ and are beyond the body zone from causing irregularity of the contour line $PT_b$ of the top surface $fr_p^t$.

In this embodiment, the used curve smoothing algorithm may be a Laplace smoothing algorithm. In this algorithm, a formula $$\delta_i = L(pt_i) = \frac{1}{N} \sum_{j \in N(i)} (pt_i - pt_j)$$

is first used to acquire an original Laplace vector $\delta_i$ of each point on the contour line $PT_b$ of the top surface $fr_p^t$, where L represents a Laplace operator, and $\{pt_i, j \in N(i)\}$ are two adjacent points. A location of each point on a transformed contour line of the top surface $fr_p^t$ is obtained by means of calculation by using the following energy function:

$$E(PT_b') = \sum_{pt_i \in PT_b} \|L(pt_i') - \delta_i\|^2 + \sum_{pt_i \in PT_f} \|pt_i' - pt_i\|^2 + \sum_{pt_i \in PT_o} \|pt_i' - pt_i\|^2,$$

where $pt_i$ and $pt_i'$ are locations of a point before and after transformation.

Figure 3C:
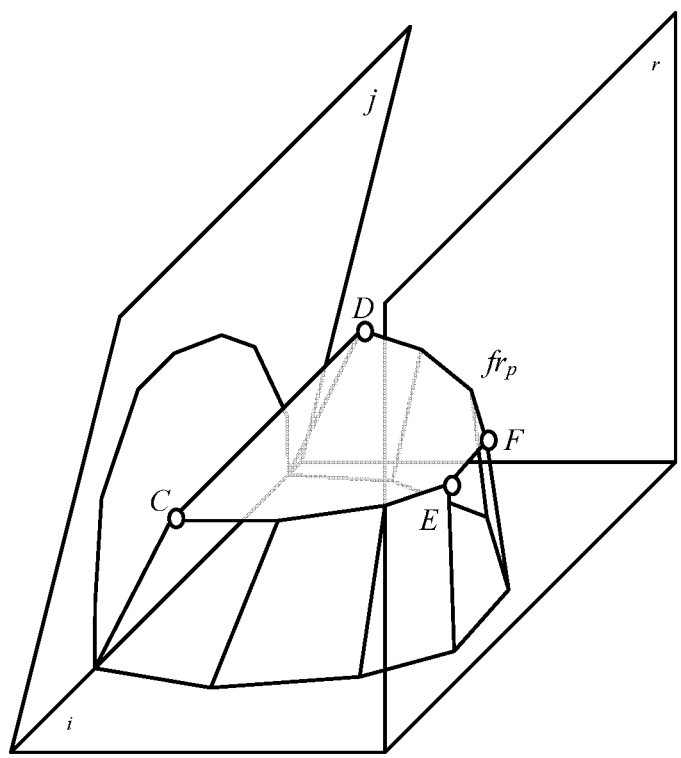

In the following, it is determined whether there is still a point that is beyond the body zone on the transformed contour line of the top surface $fr_p^t$ of the geometry $fr_p$. If there is still a point that is beyond the body zone, the foregoing process is repeated to perform an iterative operation, until all points on the transformed contour line of the top surface $fr_p^t$ of the geometry $fr_p$ are located within the body zone. The geometry $fr_p$ that has undergone transformation processing is shown in FIG. 3C.

In addition, it should be noted that the curve smoothing algorithm in this embodiment may also be replaced with another curve smoothing algorithm, for example, a second-order Laplace smoothing algorithm or a $\lambda\|\mu$ low-pass smoothing algorithm, which is not limited herein. After a finite quantity of iterative operations, change of obtained results is increasingly smaller, that is, a change of a shape of a curved surface is extremely small. Therefore, a difference between shapes of curved surfaces that are obtained by using different smoothing algorithms is extremely small.

Figure 3D:
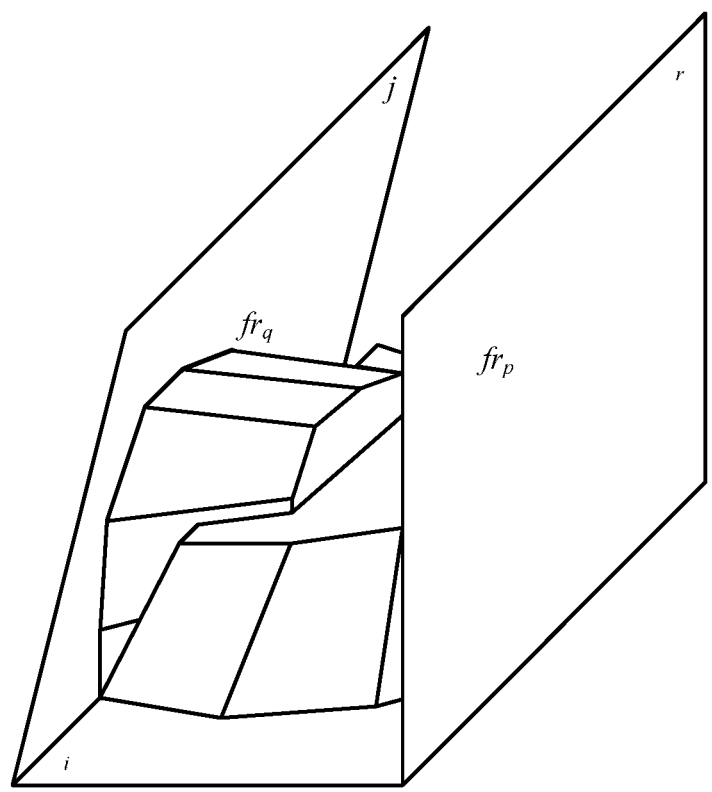

A geometry $fr_q$ is generated according to a processing method that is the same as that for the geometry $fr_p$, where the section line $Cs_q$ is interpolated into the surface of the geometry $fr_q$, and it should be ensured that the generated geometry $fr_p$ intersects with the geometry $fr_q$. Intersection between the geometry $fr_p$ and the geometry $fr_q$ may include the following several situations: intersecting at only one point, intersecting at one line, intersecting at one plane, and intersecting to form one three-dimensional zone. In this embodiment, an intersecting part between the geometry $fr_p$ and the geometry $fr_q$ is a three-dimensional zone, which can ensure that a surface of a subsequently calculated union of the geometry $fr_p$ and the geometry $fr_q$ is a closed manifold into which the section lines $Cs_p$ and $Cs_q$ are interpolated. Next, the union $u_x$ of the geometries $fr_p$ and $fr_q$ is calculated, and the surface of $u_x$ is extracted and used as the sub-curved surface generated within the body zone. The sub-curved surface within the body zone is shown in FIG. 3D.

For the end zone, a section line is included on only one plane in the zone. For a specific processing method, reference may be made to FIG. 4A and FIG. 4B.

Figure 4A:
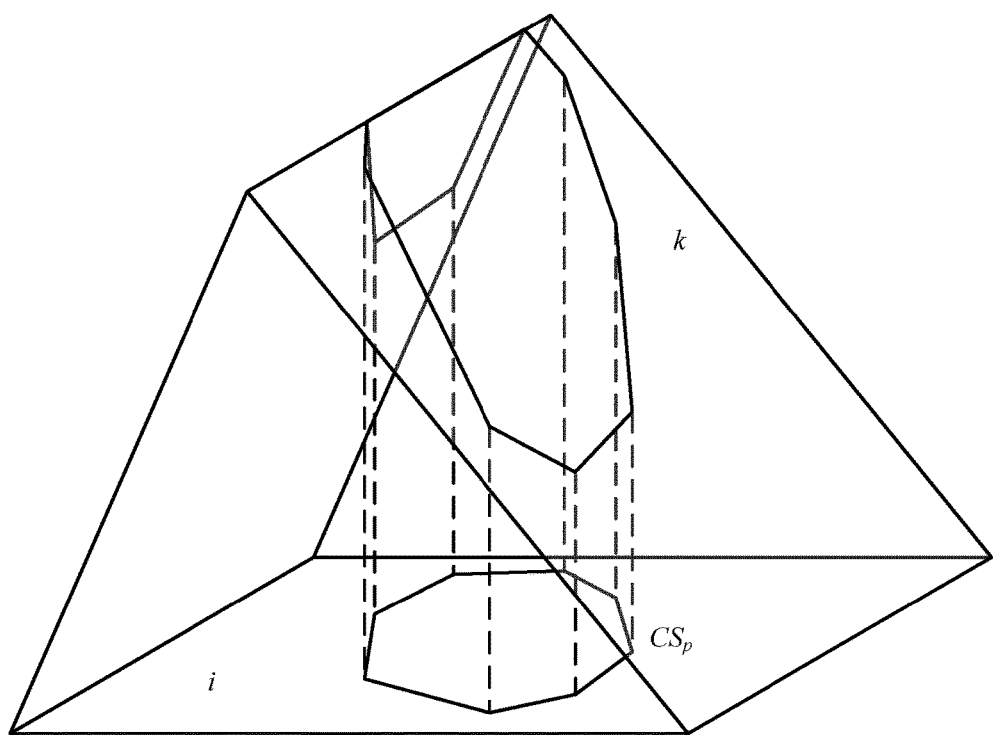
FIG. 4A to FIG. 4B are schematic diagrams of an embodiment of a method for generating a sub-curved surface within an end zone.
Figure 4B:
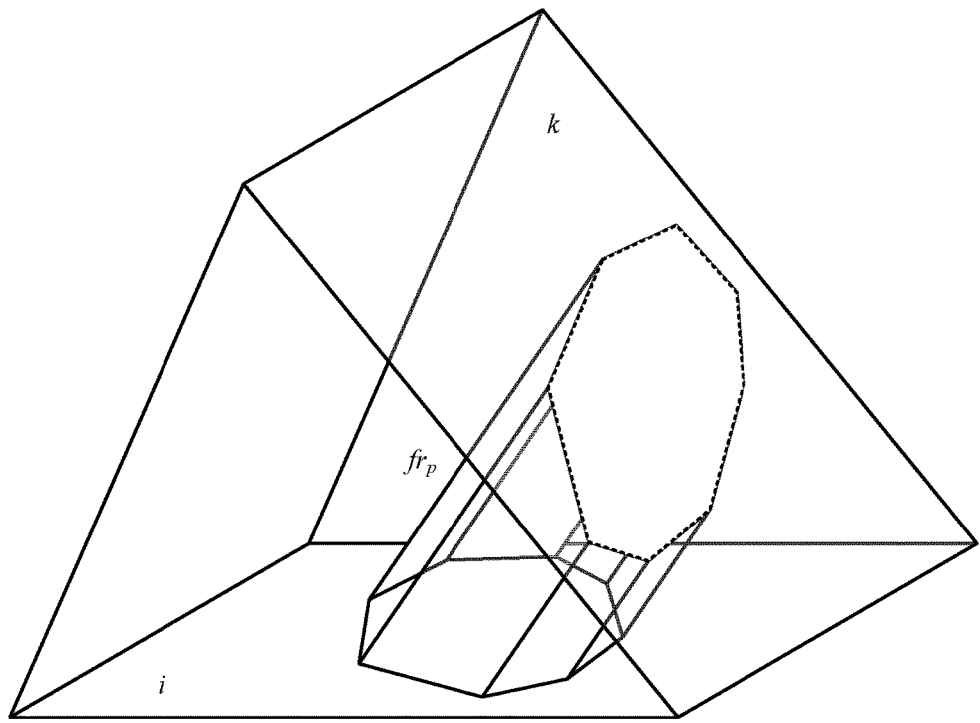

First, referring to FIG. 4A, in an end zone shown in the figure, only a plane i includes a section line $Cs_p$. A zone enclosed by the section line $Cs_p$ on the plane i is used as a bottom surface. The bottom surface is projected in a direction perpendicular to the bottom surface onto another plane constituting the end zone, and a plane k with a largest projection area is found. The bottom surface is projected in a direction perpendicular to the plane k with the largest projection area to obtain a projection contour line that is formed on the plane k with the largest projection area by the bottom surface. The contour line is connected to the bottom surface to form a geometry $fr_p$. The formed geometry $fr_p$ is shown in FIG. 4B, where the bottom surface of the geometry $fr_p$ is located on the plane i on which the section line $Cs_p$ is located, and a top surface of the geometry $fr_p$ is located on the plane k with the largest projection area.

Because a section line is included on only one plane within the end zone, the geometry generated in the end zone does not intersect with another geometry. After sub-curved surfaces within the body zone are spliced to form an initial curved surface model, a sub-curved surface within the end zone becomes an isolated component. As a result, multiple disconnected components may be included in a creation result. To prevent this situation, after the geometry $fr_p$ located within the end zone is generated, the geometry $fr_p$ is extended to the body zone and/or another end zone, so that the geometry $fr_p$ intersects with a geometry within the body zone and/or the another end zone. Finally, the surface of the geometry $fr_p$ is extracted to generate a sub-curved surface that is located within the end zone, where the section line included in the zone is interpolated into the sub-curved surface.

For the empty zone, because no section line is included on any plane in the zone, there is no need to generate a geometry, that is, there is no need to process the empty zone.

In addition, when a new section line is input, the three-dimensional space may be redivided into zones according to a plane on which the newly input section line is located. Then, a geometry is regenerated only for a zone affected by the newly input section line, and a new sub-curved surface is formed. A sub-curved surface within another zone that is not affected by the newly input section line retains unchanged. Then, sub-curved surfaces of all zones are spliced to form an updated curved surface model of the target object. This method of retaining a sub-curved surface within a zone that is not affected unchanged can reduce complexity of calculation, so that a change of a recreation result is natural and predictable, thereby improving efficiency in dynamically creating a curved surface. The curved surface model, which is established in this embodiment, of the target object may be a subdivision curved surface model or may be a triangle mesh curved surface model.

The present invention may be used to create an air gesture-based 3D model in augmented reality. In a conventional 3D modeling method, a user inputs information about a point and a line to a physical plane by using an input device such as a mouse or a stylus, and then needs to map 2D input data to 3D space by using various methods and generate a 3D model by using data obtained after the mapping. In comparison, the air gesture-based 3D model creation is a more natural and convenient 3D model creation method. In this method, the user may depict a contour shape of a target 3D model by hand in the 3D space, and may obtain, by using various 3D location sensors (such as Kinect or Leap Motion), 3D coordinates of data input by a gesture of the user and generate the 3D model directly according to these pieces of 3D data. Therefore, a problem of relatively poor intuitiveness and convenience that are brought by mapping from 2D data to 3D data in the conventional modeling method is prevented. When the present invention is applied to the air gesture-based 3D modeling, the user may input section lines representing a contour of a target 3D object by hand, and then obtain shape and location data of the input 3D section lines by using an spatial location sensor, and generate the target 3D model from these section lines by using the technical solution provided in the present invention. Each time the user inputs one new section line, according to the present invention, a 3D model into which the currently input section line is interpolated can be obtained by means of calculation, a real-time recreation result may be presented to the user by using an augmented reality technology, and the user may continue to input a section line by hand by using the real-time recreation result as a reference, until an ideal 3D model is obtained.

In this embodiment, after three-dimensional space is divided into zones, the zones obtained by means of division are then classified, and then geometries are generated by using different methods for zones of different types. A process of generating a geometry is mainly based on a shape of a zone and a section line located in the zone, that is, creation of a geometry of each zone does not need to depend on an axial plane set of each zone. Therefore, local topological noises are prevented, and topological quality of a curved surface model is improved.

Figure 5:
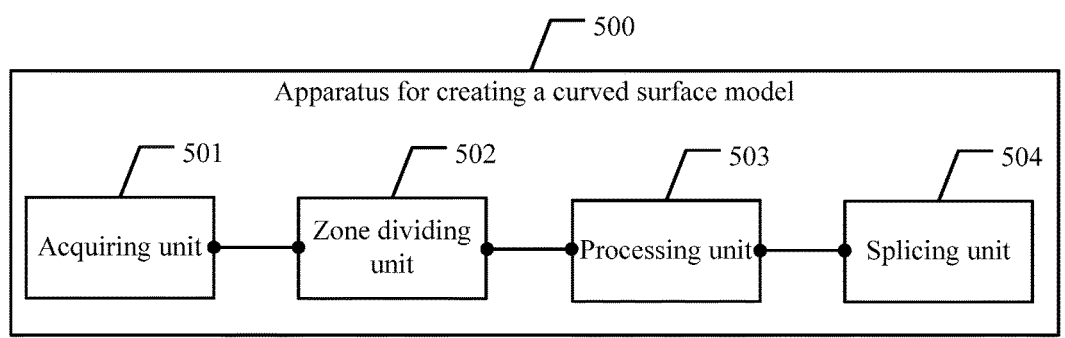
FIG. 5 is a schematic diagram of an embodiment of an apparatus for creating a curved surface model according to the present invention.

The following describes an apparatus for creating a curved surface model according to an embodiment of the present invention. Referring to FIG. 5, an apparatus 500 in this embodiment includes an acquiring unit 501 configured to acquire an already input section line of a target object; a zone dividing unit 502 configured to divide three-dimensional space into zones by using a plane on which the already input section line of the target object is located; a processing unit 503 configured to generate, according to a shape of each zone and a section line included in each zone, a geometry located within each zone, where the section line included in each zone is interpolated into the surface of the geometry, and extract the surface of the geometry located within each zone to generate a sub-curved surface located within each zone, where a section line included in the zone is interpolated into the sub-curved surface; and a splicing unit 504 configured to splice all sub-curved surfaces to obtain a curved surface model of the target object.

Figure 6:
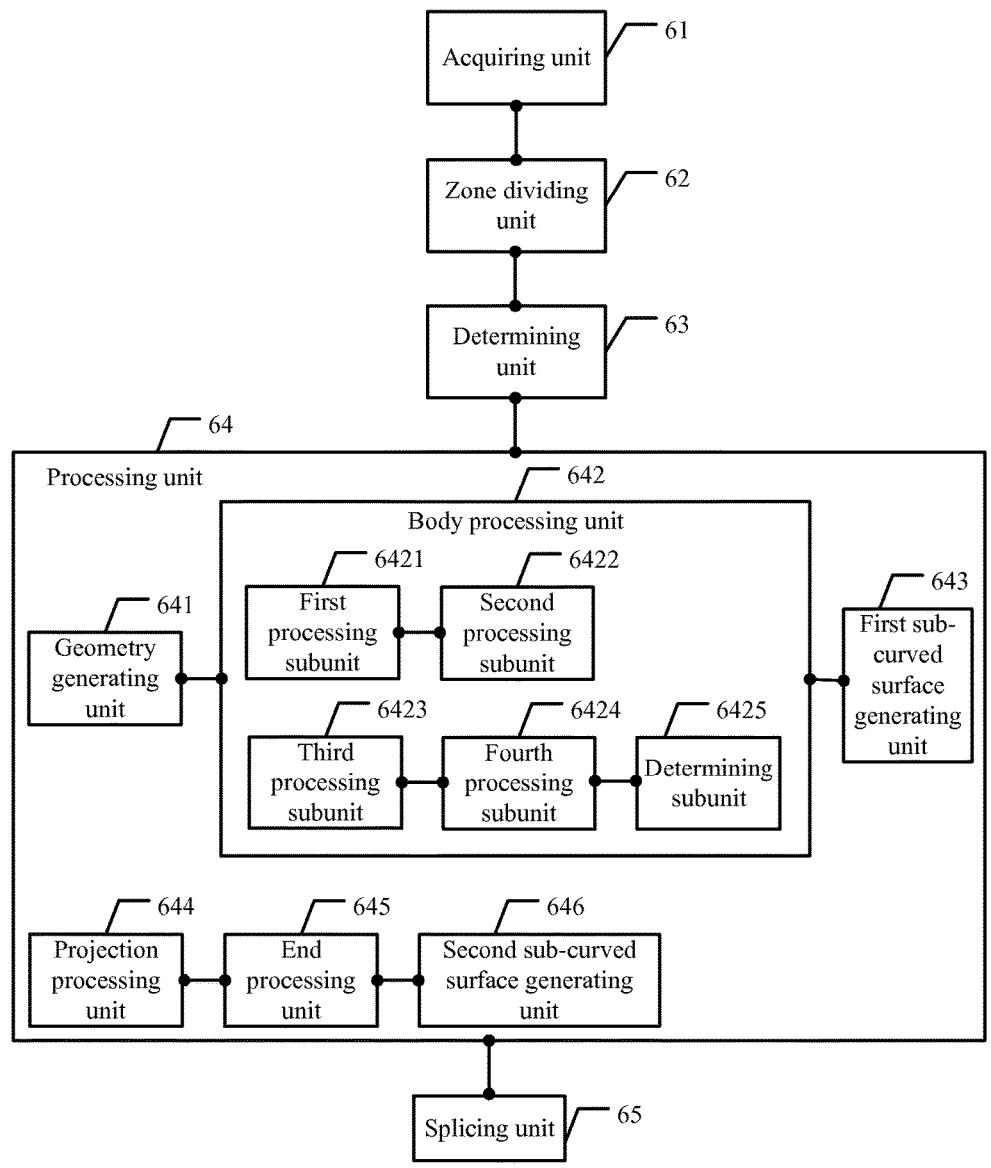
FIG. 6 is a schematic diagram of another embodiment of an apparatus for creating a curved surface model according to the present invention.

For ease of understanding, the following describes an apparatus for creating a curved surface model according to an embodiment of the present invention by using a specific embodiment. Referring to FIG. 6, the apparatus in this embodiment includes an acquiring unit 61 configured to acquire an already input section line of a target object; a zone dividing unit 62 configured to divide three-dimensional space into zones by using a plane on which the already input section line of the target object is located; a determining unit 63 configured to determine a type of each zone after the zone dividing unit 62 divides the three-dimensional space into zones, where the type of the zone includes body zone, end zone, and empty zone; a processing unit 64 configured to generate, according to a shape of each zone and a section line included in each zone, a geometry located within each zone, where the section line included in each zone is interpolated into the surface of the geometry, and extract the surface of the geometry located within each zone to generate a sub-curved surface located within each zone, where a section line included in the zone is interpolated into the sub-curved surface; and a splicing unit 65 configured to splice all sub-curved surfaces to obtain a curved surface model of the target object.

The processing unit 64 includes a geometry generating unit 641, a body processing unit 642, and a first sub-curved surface generating unit 643, and is configured to generate a sub-curved surface located within a body zone when the determining unit 63 determines that a zone is the body zone.

Further, when section lines included within the body zone do not intersect, the body processing unit 642 includes a first processing subunit 6421 and a second processing subunit 6422, or when section lines included within the body zone intersect, the body processing unit 642 includes a third processing subunit 6423, a fourth processing subunit 6424, and a determining subunit 6425.

In addition, the processing unit 64 further includes a projection processing unit 644, an end processing unit 645, and a second sub-curved surface generating unit 646, and is configured to generate a sub-curved surface located within an end zone when the determining unit 63 determines that a zone is the end zone.

For ease of understanding, the following uses an actual application scenario to describe a manner of interaction between the units of the apparatus for creating a curved surface model according to this embodiment. Details are as follows.

First, the acquiring unit 61 acquires the already input section line of the target object. The section line of the target object mentioned in this embodiment is a closed plane curve, and two section lines located on a same plane do not intersect; for a section line a and a section line b that are respectively located on any two non-parallel planes, namely, a plane i and a plane j, an intersection point set of the section line a and the plane j is consistent with an intersection point set of the section line b and the plane i, thereby ensuring that the established curved surface model is effective.

The zone dividing unit 62 divides the three-dimensional space into zones by using the plane on which the already input section line, which is acquired by the acquiring unit 61, of the target object is located; the determining unit 63 determines a type of each zone divided by the zone dividing unit 62, where each zone is a closed spatial zone constituted by planes in different directions, and one section line may be included within one or more closed zones. A specific method for determining the type of each zone may be as follows: if section lines are included on two or more planes in all planes constituting a zone, the determining unit 63 determines that the zone is a body zone; if a section line is included on only one plane in all planes constituting a zone, the determining unit 63 determines that the zone is an end zone; and if a section line is included on any plane in all planes constituting a zone, the determining unit 63 determines that the zone is an empty zone.

Next, zones of different types are processed by using different processing methods.

For the body zone, section lines are included on two or more planes in the body zone, and the section lines included on the two or more planes may intersect or may not intersect, which are separately described below.

First, referring to FIG. 2A to FIG. 2D, FIG. 2A to FIG. 2D describe a process of generating, when the section lines included on the two or more planes in the body zone do not intersect, a sub-curved surface that is located within the body zone, where the section lines included in the body zone are interpolated into the sub-curved surface.

As shown in FIG. 2A, section lines $Cs_p$ and $Cs_q$ are respectively included on a plane i and a plane j within a body zone, and $Cs_p$ and $Cs_q$ do not intersect. First, the geometry generating unit 641 selects the plane i. A zone enclosed by the section line $Cs_p$ included on the plane i is used as a bottom surface $fr_p^b$. The bottom surface $fr_p^b$ is translated in a direction perpendicular to the bottom surface $fr_p^b$ to establish a geometry $fr_p$ whose top surface $fr_p^t$ is in a same shape as the bottom surface $fr_p^b$, where the section line $Cs_p$ is interpolated into the surface of the geometry $fr_p$. A height (that is, a translation distance) of the geometry is $h_p = \delta * h_{ij}$, where $\delta \in (0,1)$, and $h_{ij}$ is a shortest distance between a center of the section line $Cs_p$ and a point at which a ray starting with the center of the section line $Cs_p$ and emitted in the direction perpendicular to the bottom surface $fr_p^b$ intersects with another plane constituting the body zone. The established geometry $fr_p$ is shown in FIG. 2B.

After establishment of the geometry $fr_p$ including the section line $Cs_p$ is complete, the geometry $fr_p$ may be beyond the body zone. If the geometry $fr_p$ is beyond the body zone, the geometry $fr_p$ needs to be processed, so that the geometry $fr_p$ is located within the body zone. A specific processing method may be as follows: the first processing subunit 6421 moves all points on a contour line of the top surface $fr_p^t$ of the geometry $fr_p$ towards a center of the top surface $fr_p^t$ until all the points on the contour line of the top surface $fr_p^t$ are located within the body zone, or the second processing subunit 6422 decreases δ to reduce the height of the geometry $fr_p$, so that all points on a contour line of the top surface $fr_p^t$ of the geometry $fr_p$ are located within the body zone.

In addition, the first processing subunit 6421 and the second processing subunit 6422 may also be combined, that is, the first processing subunit 6421 first moves all points on a contour line of the top surface $fr_p^t$ of the geometry $fr_p$ towards a center of the top surface $fr_p^t$, and when a ratio of a moving distance to an initial distance from the center of the top surface $fr_p^t$ reaches a preset threshold, triggers the second processing subunit 6422 to reduce the height of the geometry $fr_p$, so that all the points on the contour line of the top surface $fr_p^t$ of the geometry $fr_p$ are located within the body zone. The processed geometry $fr_p$ is shown in FIG. 2C.

Next, a geometry $fr_q$ is generated according to a processing method that is the same as that for the geometry $fr_p$, where the section line $Cs_q$ is interpolated into the surface of the geometry $fr_q$, and the first sub-curved surface generating unit 643 calculates a union of the geometries $fr_p$ and $fr_q$. A calculation formula is $$u_x = \bigcup_{y=1}^{n} fr_{xy},$$

where $\cup$ is a union operator, $fr_{xy}$ represents the yth geometry in a zone x, n is a total quantity of geometries in the zone x, and $u_x$ is a union of the geometries in the zone x. After the union $u_x$ of the geometries are obtained by means of calculation, a surface of $u_x$ is extracted and used as the sub-curved surface generated within the body zone. The sub-curved surface within the body zone is shown in FIG. 2D.

Referring to FIG. 3A to FIG. 3D below, FIG. 3A to FIG. 3D describe a process of generating, when the section lines included on the two or more planes in the body zone intersect, a sub-curved surface that is located within the body zone, where the section lines included in the body zone are interpolated into the sub-curved surface.

As shown in FIG. 3A, a plane i, a plane j, and a plane r are included within a body zone, section lines $Cs_p$ and $Cs_q$ are respectively included on the plane i and the plane j, and $Cs_p$ intersects with $Cs_q$. First, the geometry generating unit 641 selects the plane i. A zone enclosed by the section line $Cs_p$ included on the plane i is used as a bottom surface $fr_p^b$. The bottom surface $fr_p^b$ is translated in a direction perpendicular to the bottom surface $fr_p^b$ to establish a geometry $fr_p$ whose top surface $fr_p^t$ is in a same shape as the bottom surface $fr_p^b$, where the section line $Cs_p$ is interpolated into the surface of the geometry $fr_p$. A height (that is, a translation distance) of the geometry is $h_p = \delta * h_{ij}$, where $\delta \in (0,1)$, and $h_{ij}$ is a shortest distance between a center of the section line $Cs_p$ and a point at which a ray starting with the center of the section line $Cs_p$ and emitted in the direction perpendicular to the bottom surface $fr_p^b$ intersects with another plane constituting the body zone. The established geometry $fr_p$ is shown in FIG. 3B.

In FIG. 3B, points A and B are points that are beyond the body zone; points $C_0$ and $D_0$ are points that are on the section line $Cs_p$ and are at a distance shorter than a first distance threshold from the plane j on which the section line $Cs_q$ is located, points C and D are points that are on the top surface $fr_p^t$ of the geometry $fr_p$ and are corresponding to locations of $C_0$ and $D_0$, and the points C and D belong to a point set $PT_f$; points E and F are points that are on a contour line of the top surface $fr_p^t$ of the geometry $fr_p$ and are at a distance shorter than a second distance threshold from the plane r, and the points E and F belong to a point set $PT_0$. The first distance threshold and the second distance threshold may be preset according to actual needs.

When the section lines $Cs_p$ and $Cs_q$ intersect, to ensure that the points C and D on the top surface $fr_p^t$ of the geometry $fr_p$ established by the geometry generating unit 641 are located within the body zone, the height of the geometry $fr_p$ may be adjusted herein for implementation. This restriction is for ensuring that a union of the geometry $fr_p$ and a subsequently established geometry $fr_q$ into which the section line $Cs_q$ is interpolated is a geometry with a manifold surface.

It can be seen from FIG. 3B that, because the established geometry $fr_p$ is beyond the body zone, the geometry $fr_p$ needs to be processed, so that the geometry $fr_p$ is located within the body zone. A specific processing method may be as follows: first, the third processing subunit 6423 moves points (such as points A and B) that are on the contour line of the top surface $fr_p^t$ of the geometry $fr_p$ and are beyond the body zone towards a center of the top surface $fr_p^t$ until all points on the contour line of the top surface $fr_p^t$ are located within the body zone; and next, the fourth processing subunit 6424 performs transformation on a contour line, obtained after the moving, $PT_b$ of the top surface $fr_p^t$ of the geometry $fr_p$ by using a curve smoothing algorithm, and in a transformation process, retains a point $PT_0$ (such as a point E or F) that is on the contour line, obtained after the moving, of the top surface $fr_p^t$ and is at a distance shorter than the second distance threshold from the another plane constituting the body zone. An objective for performing transformation on the contour line $PT_b$ of the top surface $fr_p^t$ of the geometry $fr_p$ is to prevent previous moving of the points that are on the contour line of the top surface $fr_p^t$ and are beyond the body zone from causing irregularity of the contour line $PT_b$ of the top surface $fr_p^t$.

In this embodiment, the used curve smoothing algorithm may be a Laplace smoothing algorithm. In this algorithm, a formula $$\delta_i = L(pt_i) = \frac{1}{N} \sum_{j \in N(i)} (pt_i - pt_j)$$

is first used to acquire an original Laplace vector $\delta_i$ of each point on the contour line of the top surface $fr_p^t$, where L represents a Laplace operator, and $\{pt_j, j \in N(i)\}$ are two adjacent points. A location of each point on a transformed contour line of the top surface $fr_p^t$ is obtained by means of calculation by using the following energy function:

$$E(PT_b') = \sum_{pt_i \in PT_b} \|L(pt_i') - \delta_i\|^2 + \sum_{pt_i \in PT_f} \|pt_i' - pt_i\|^2 + \sum_{pt_i \in PT_0} \|pt_i' - pt_i\|^2,$$

where $pt_i$ and $pt_i'$ are locations of a point before and after transformation.

In the following, the determining subunit 6425 determines whether there is still a point that is beyond the body zone on the transformed contour line of the top surface $fr_p^t$ of the geometry $fr_p$. If there is still a point that is beyond the body zone, the third processing subunit 6423 and the fourth processing subunit 6424 are repeatedly invoked to perform an iterative operation until all points on the transformed contour line of the top surface $fr_p^t$ of the geometry $fr_p$ are located within the body zone. The geometry $fr_p$ that has undergone transformation processing is shown in FIG. 3C.

In addition, it should be noted that the curve smoothing algorithm in this embodiment may also be replaced with another curve smoothing algorithm, for example, a second-order Laplace smoothing algorithm or a $\lambda|\mu$ low-pass smoothing algorithm, which is not limited herein. After a finite quantity of iterative operations, change of obtained results is increasingly smaller, that is, a change of a shape of a curved surface is extremely small. Therefore, a difference between shapes of curved surfaces that are obtained by using different smoothing algorithms is extremely small.

A geometry $fr_q$ is generated by the geometry generating unit 641 according to a processing method that is the same as that for the geometry $fr_p$, where the section line $Cs_q$ is interpolated into the surface of the geometry $fr_q$, and it should be ensured that the generated geometry $fr_p$ intersects with the generated geometry $fr_q$. Intersection between the geometry $fr_p$ and the geometry $fr_q$ may include the following several situations: intersecting at only one point, intersecting at one line, intersecting at one plane, and intersecting to form one three-dimensional zone. In this embodiment, an intersecting part between the geometry $fr_p$ and the geometry $fr_q$ is a three-dimensional zone, which can ensure that a surface of a subsequently calculated union of the geometry $fr_p$ and the geometry $fr_q$ is a closed manifold into which the section lines $Cs_p$ and $Cs_q$ are interpolated. Next, the first sub-curved surface generating unit 643 calculates the union $u_x$ of the geometries $fr_p$ and $fr_q$, and extracts the surface of $u_x$ and uses the surface of $u_x$ as the sub-curved surface generated within the body zone. The sub-curved surface within the body zone is shown in FIG. 3D.

For the end zone, a section line is included on only one plane in the zone. For a specific processing method, reference may be made to FIG. 4A and FIG. 4B.

First, referring to FIG. 4A, in an end zone shown in the figure, only a plane i includes a section line $Cs_p$. The projection processing unit 644 uses a zone enclosed by the section line $Cs_p$ on the plane i as a bottom surface, projects the bottom surface in a direction perpendicular to the bottom surface onto another plane constituting the end zone, and finds a plane k with a largest projection area; projects the bottom surface in a direction perpendicular to the plane k with the largest projection area to obtain a vertical projection contour line that is formed on the plane k with the largest projection area by the bottom surface. The end processing unit 645 connects the contour line to the bottom surface to form a geometry $fr_p$. The formed geometry $fr_p$ is shown in FIG. 4B, where the bottom surface of the geometry $fr_p$ is located on the plane i on which the section line $Cs_p$ is located, and a top surface of the geometry $fr_p$ is located on the plane k with the largest projection area. The second sub-curved surface generating unit 646 extracts the surface of the geometry $fr_p$ to generate a sub-curved surface that is located within the end zone, where the section line included in the zone is interpolated into the sub-curved surface.

Because a section line is included on only one plane within the end zone, the geometry generated in the end zone does not intersect with another geometry. After the end processing unit 645 splices sub-curved surfaces within the body zone to form an initial curved surface model, a sub-curved surface within the end zone becomes an isolated component. As a result, multiple disconnected components may be included in a creation result. To prevent this situation, after the geometry $fr_p$ located within the end zone is generated, the end processing unit 645 extends the geometry $fr_p$ to the body zone and/or another end zone, so that the geometry $fr_p$ intersects with a geometry within the body zone and/or the another end zone.

For the empty zone, because no section line is included on any plane in the zone, there is no need to generate a geometry, that is, the processing unit 64 does not need to process the end zone.

In addition, when a new section line is input, the zone dividing unit 62 may redivide the three-dimensional space into zones according to a plane on which the newly input section line is located. Then, the processing unit 64 regenerates a geometry only for a zone affected by the newly input section line and forms a new sub-curved surface. A sub-curved surface within another zone that is not affected by the newly input section line remains unchanged. Then, the splicing unit 65 splices sub-curved surfaces of all zones to form an updated curved surface model of the target object. This method of retaining a sub-curved surface within a zone that is not affected unchanged can reduce complexity of calculation, so that a change of a recreation result is natural and predictable, thereby improving efficiency in dynamically creating a curved surface. The curved surface model, which is established in this embodiment, of the target object may be a subdivision curved surface model or may be a triangle mesh curved surface model.

In this embodiment, after a zone dividing unit divides three-dimensional space into zones, a determining unit classifies the zones obtained by means of division, and then a processing unit generates geometries by using different methods for zones of different types. A process of generating a geometry is mainly based on a shape of a zone and a section line located in the zone, that is, creation of a geometry of each zone does not need to depend on an axial plane set of each zone. Therefore, local topological noises are prevented, and topological quality of the curved surface model is improved.

Figure 7:
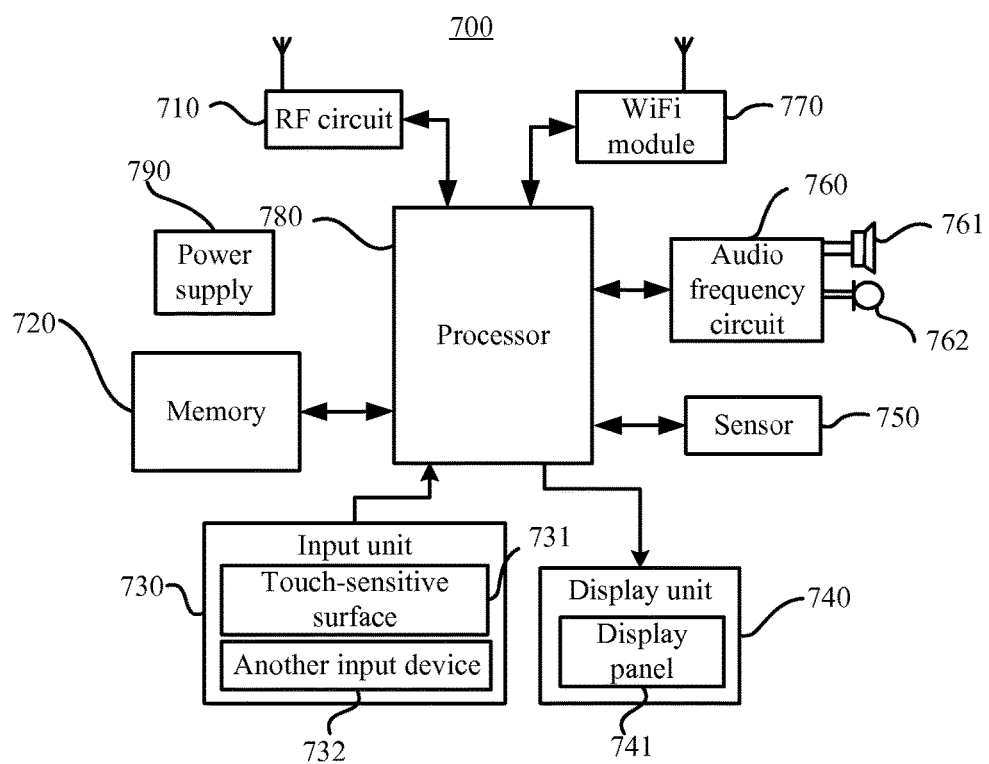
FIG. 7 is a schematic diagram of another embodiment of an apparatus for creating a curved surface model according to the present invention.

FIG. 7 is a schematic structural diagram of an apparatus 700 for creating a curved surface model according to an embodiment of the present invention. Referring to FIG. 7, the apparatus may be configured to implement the method for creating a curved surface model according to the foregoing embodiment. In an actual application, the apparatus may be integrated into an electronic device, where the electronic device may be a computer or the like.

The apparatus may include parts such as a Radio Frequency (RF) circuit 710, a memory 720 that includes one or more computer-readable storage mediums, an input unit 730, a display unit 740, a sensor 750, an audio frequency circuit 760, a wireless fidelity (WiFi) module 770, a processor 780 that includes one or more processing cores, and a power supply 790. A person skilled in the art may understand that a structure of a terminal shown in FIG. 7 does not constitute a limitation on the apparatus for creating a curved surface model, and parts more or less than those in the figure may be included, some parts may be combined, or the parts may be arranged in a different way.

The RF circuit 710 may be configured to receive and send a signal in a message receiving and sending process or a call process, and in particular, after downlink information of a base station is received, send the downlink information to one or more processors 780 for processing; in addition, send uplink relevant data to the base station. Generally, the RF circuit 710 includes but is not limited to an antenna, at least one amplifier, a tuner, one or more oscillators, a subscriber identity module (SIM) card, a transceiver, a coupler, a Low Noise Amplifier (LNA), a duplexer, and the like. In addition, the RF circuit 710 may further communicate with another device through wireless communications and a network. The wireless communications may use any communications standard or protocol, which includes but is not limited to Global System for Mobile communication (GSM), General Packet Radio Service (GPRS), Code Division Multiple Access (CDMA), Wideband Code Division Multiple Access (WCDMA), Long Term Evolution (LTE), electronic mail (email), Short Messaging Service (SMS), and the like.

The memory 720 may be configured to store a software program and a module, and the processor 780 executes, by running the software program and the module that are stored in the memory 720, various functional applications and data processing. The memory 720 may mainly include a program storage area and a data storage area. The program storage area may store an operating system, an application program that is required by at least one function (such as a sound playing function or an image playing function), and the like. The data storage area may store data (such as audio data or a phone book) that is created according to use of the apparatus, and the like. In addition, the memory 720 may include a high-speed random access memory, and may further include a non-volatile memory, for example, at least one magnetic disk storage device, a flash device, or another volatile solid-state storage device. Correspondingly, the memory 720 may further include a storage controller, so as to provide the processor 780 and the input unit 730 with access to the memory 720.

The input unit 730 may be configured to receive input digit or character information, and generate keyboard signal input, mouse signal input, joystick signal input, optical signal input, or trackball signal input related to user setting and functional control. The input unit 730 may include a touch-sensitive surface 731 and another input device 732. The touch-sensitive surface 731, also called a touchscreen or a touchpad, may collect a touch operation (such as an operation that a user performs on the touch-sensitive surface 731 or near the touch-sensitive surface 731 by using a finger, a stylus, or any other suitable object or accessory) of a user on or near the touch-sensitive surface 731, and drives a corresponding connection apparatus according to a preset program. Optionally, the touch-sensitive surface 731 may include two parts: a touch detection apparatus and a touch controller. The touch detection apparatus detects a touch location of a user, detects a signal brought by a touch operation, and transmits the signal to the touch controller. The touch controller receives touch information from the touch detection apparatus, converts the touch information into touch coordinates, and sends the touch coordinates to the processor 780, and can receive and execute a command sent by the processor 780. In addition, the touch-sensitive surface 731 may be implemented in multiple types, such as resistance, capacitive, infrared ray, and surface acoustic wave. In addition to the touch-sensitive surface 731, the input unit 730 may further include another input device 732. The another input device 732 may include but is not limited to one or more of a physical keyboard, a functional key (such as a volume control key or a switch key), a trackball, a mouse, a joystick, and the like.

The display unit 740 may be configured to display information input by a user or information provided to a user and various graphic user interfaces of the apparatus, where the graphic user interfaces may be constituted by a graph, a text, an icon, a video, and any combination thereof. The display unit 740 may include a display panel 741, and optionally, the display panel 741 may be configured in a form of a Liquid Crystal Display (LCD), an Organic Light-Emitting Diode (OLED), or the like. Further, the touch-sensitive surface 731 may cover the display panel 741. When detecting a touch operation on or near the touch-sensitive surface 731, the touch-sensitive surface 731 transmits a signal, which is brought by the touch operation, to the processor 780 to determine a type of a touch event, and then the processor 780 provides corresponding visual output on the display panel 741 according to the type of the touch event. In FIG. 7, although the touch-sensitive surface 731 and the display panel 741 are used as two independent parts for implementing input and output functions, in some embodiments, the touch-sensitive surface 731 may be integrated with the display panel 741 to implement the input and output functions.

The apparatus for creating a curved surface model may further include at least one type of sensor 750, such as an optical sensor, a motion sensor, and another sensor. The optical sensor may include an ambient light sensor and a proximity sensor. The ambient light sensor may adjust brightness of the display panel 741 according to brightness of ambient light, and the proximity sensor may turn off the display panel 741 and/or backlight when the apparatus approaches an ear. As one type of a motion sensor, a gravity acceleration sensor can detect a value of an acceleration in various directions (generally, three axes), can detect a value and a direction of the gravity under a static condition, and can be used for an application (such as portrait and landscape screen orientation, related games, and magnetometer posture calibration) that identifies a gesture of the apparatus, a function (such as a pedometer, and a stroke) related to vibration identification, and the like. Details of another sensor such as a gyroscope, a barometer, a hygrometer, a thermometer, and an infrared sensor that may be further configured by the apparatus for creating a curved surface model are not described herein again.

The audio frequency circuit 760, a loudspeaker 761, and a microphone 762 can provide an audio interface between a user and the apparatus. The audio frequency circuit 760 may transmit, to the loudspeaker 761, an electrical signal converted from received audio data, and the loudspeaker 761 converts the electrical signal into a sound signal for outputting. On another aspect, the microphone 762 converts a collected sound signal into an electrical signal, the audio frequency circuit 760 receives the electrical signal and then converts the electrical signal into audio data and outputs the audio data to the processor 780 for processing, and then the audio data is sent to, for example, another terminal, through the RF circuit 710, or the audio data is output to the memory 720 for further processing. The audio frequency circuit 760 may further include an earplug jack for providing communication between an external earphone and the apparatus.

WiFi belongs to a short-distance wireless transmission technology. The apparatus for creating a curved surface model may help, by using the WiFi module 770, a user to receive and send an email, browse a web page, access a streaming media, and the like. The WiFi module 770 provides the user with wireless broadband Internet access. Although the WiFi module 770 is shown in FIG. 7, it can be understood that the WiFi module 770 is not an indispensable component of the apparatus and may be totally omitted according to a need within a scope of retaining the essence of the present invention.

The processor 780 is a control center of the apparatus for creating a curved surface model, connects all parts of the whole apparatus by using various interfaces and cables, and executes various functions and processing data of the apparatus by running or executing a software program and/or a module stored in the memory 720 and by invoking data stored in the memory 720, thereby performing overall monitoring on a mobile phone. Optionally, the processor 780 may include one or more processing cores. Preferably, the processor 780 may integrate an application processor and a modulation and demodulation processor. The application processor mainly processes an operating system, a user interface, an application program, and the like, and the modulation and demodulation processor mainly processes wireless communications. It can be understood that the processor 780 may also not integrate the modulation and demodulation processor.

The apparatus for creating a curved surface model further includes the power supply 790 (such as a battery) that supplies power to the parts. Preferably, the power supply may be logically connected to the processor 780 by using a power management system, so that the power management system implements a function such as charging management, discharging management, and power consumption management. The power supply 790 may further include one or more direct current power supplies or alternating current power supplies, a recharging system, a power fault detection circuit, a power converter or inverter, a power status indicator, and any other component.

The apparatus for creating a curved surface model may further include a camera, a BLUETOOTH module, and the like, although they are not shown. Details are not described herein again. In this embodiment, the apparatus for creating a curved surface model includes a memory and one or more programs, where the one or more programs are stored in the memory, and one or more processors are configured to execute the one or more programs, where the one or more programs include an instruction used for performing the following operations: acquiring an already input section line of a target object; dividing three-dimensional space into zones by using a plane on which the already input section line of the target object is located; generating, according to a shape of each zone and a section line included in each zone, a geometry located within each zone, where the section line included in each zone is interpolated into the surface of the geometry, and extracting the surface of the geometry located within each zone to generate a sub-curved surface located within each zone, where a section line included in the zone is interpolated into the sub-curved surface; and splicing the sub-curved surfaces to obtain a curved surface model of the target object.

It should be noted that the apparatus for creating a curved surface model according to the embodiments of the present invention may be further configured to implement other functions in the foregoing apparatus embodiments, and details are not described herein again.

In addition, it should be noted that the described apparatus embodiment is merely exemplary. The units described as separate parts may or may not be physically separate, and parts displayed as units may or may not be physical units, may be located in one position, or may be distributed on a plurality of network units. Some or all of the modules may be selected according to actual needs to achieve the objectives of the solutions of the embodiments. In addition, in the accompanying drawings of the apparatus embodiments provided by the present invention, connection relationships between modules indicate that the modules have communication connections with each other, which may be implemented as one or more communications buses or signal cables. A person of ordinary skill in the art may understand and implement the embodiments of the present invention without creative efforts.

Based on the foregoing descriptions of the embodiments, a person skilled in the art may clearly understand that the present invention may be implemented by software in addition to necessary universal hardware or by dedicated hardware only, including a dedicated integrated circuit, a dedicated central processing unit (CPU), a dedicated memory, a dedicated component and the like. Generally, any functions that can be performed by a computer program can be easily implemented by using corresponding hardware. Moreover, a specific hardware structure used to achieve a same function may be of various forms, for example, in a form of an analog circuit, a digital circuit, a dedicated circuit, or the like. However, as for the present invention, software program implementation is a better implementation manner in most cases. Based on such an understanding, the technical solutions of the present invention essentially or the part contributing to the prior art may be implemented in a form of a software product. The software product is stored in a readable storage medium, such as a floppy disk, a universal serial bus (USB) flash drive, a removable hard disk, a read-only memory (ROM), a random access memory (RAM), a magnetic disk, or an optical disc of a computer, and includes several instructions for instructing a computer device (which may be a personal computer, a server, a network device, and the like) to perform the methods described in the embodiments of the present invention.

The above describes in detail a method and an apparatus for creating a curved surface model that are provided in the embodiments of the present invention. For an ordinary person skilled in the art, a modification may be made to a specific implementation manner and an application scope based on concepts of the embodiments of the present invention. Therefore, content of the specification shall not be construed as limitation to the present invention.

The invention claimed is:

1. A method for creating a curved surface model, comprising:
acquiring an already input section line of a target object;
dividing three-dimensional space into zones using a plane on which the already input section line of the target object is located;
generating, according to a shape of each zone and a section line comprised in each zone, a geometry located within each zone, wherein the section line comprised in each zone is interpolated into the surface of the geometry;
extracting the surface of the geometry located within each zone to generate a sub-curved surface located within each zone, wherein a section line comprised in a zone where the sub-curved surface is located is interpolated into the sub-curved surface; and
splicing the sub-curved surfaces to obtain a curved surface model of the target object,
wherein after dividing the three-dimensional space into zones using the plane on which the already input section line of the target object is located, the method further comprises determining a type of each zone to process zones of a same type using a same processing method, and
wherein determining the type of each zone comprises:
determining that the zone is a body zone when section lines are comprised on two or more planes in all planes constituting a zone;
determining that the zone is an end zone when a section line is comprised on only one plane in all planes constituting a zone; and
determining that the zone is an empty zone when a section line is not comprised on any plane in all planes constituting a zone.

2. The method according to claim 1, wherein processing the zones of the same type using the same processing method comprises:
for the body zone, selecting any plane comprising a section line from the body zone, using a zone enclosed by the section line within the plane as a bottom surface, and translating the bottom surface in a direction perpendicular to the bottom surface to generate a geometry whose top surface is in a same shape as the bottom surface, wherein the section line is interpolated into the surface of the geometry, wherein a height of the geometry is $h_p=\delta*h_{ij}$, and wherein $\delta\in(0,1)$ and $h_{ij}$ is a shortest distance between a center of the section line and a point at which a ray starting with the center of the section line and emitted in the direction perpendicular to the bottom surface intersects with another plane constituting the body zone;
for another section line comprised in the body zone, generating, according to the foregoing method, a geometry into which the another section line is interpolated;
processing a geometry that is beyond the body zone such that all geometries are located within the body zone;
solving a union set of all the geometries located within the body zone;
extracting a surface of the union set; and
using the surface as a sub-curved surface located within the body zone, and
wherein a section line comprised in the body zone is interpolated into the sub-curved surface.

3. The method according to claim 2, wherein the body zone comprises at least a first section line and a second section line, wherein the generated geometry located within the body zone comprises at least a first geometry and a second geometry, wherein the first section line is interpolated into a surface of the first geometry, wherein the second section line is interpolated into a surface of the second geometry, and wherein processing the geometry that is beyond the body zone such that all geometries are located within the body zone comprises:
when the first section line does not intersect with the second section line, and the first geometry and/or the second geometry are/is beyond the body zone, decreasing a value of $\delta$ of the first geometry and/or a value of $\delta$ of the second geometry to adjust a height $h_p$ of the first geometry and/or a height $h_p$ of the second geometry such that the first geometry and/or the second geometry are/is located within the body zone; and/or
moving all points on a contour line of a top surface of the first geometry and/or the second geometry towards a center of the top surface until all the points on the contour line of the top surface are located within the body zone.

4. The method according to claim 2, wherein the body zone comprises at least a first section line and a second section line, wherein the generated geometry located within the body zone comprises at least a first geometry and a second geometry, wherein the first section line is interpolated into a surface of the first geometry, wherein the second section line is interpolated into a surface of the second geometry, and when the first section line intersects with the second section line, a point that is on a contour line of a top surface of the generated first geometry and is corresponding to a point preset on the first section line is located within the body zone, and the point preset on the first section line is a point at a distance shorter than a first distance threshold from a plane on which the second section line is located.

5. The method according to claim 4, wherein processing the geometry that is beyond the body zone such that all geometries are located within the body zone comprises:
first moving a point that is on the contour line of the top surface of the first geometry and is beyond the body zone into the body zone; and
second performing transformation on a contour line, obtained after the moving, of the top surface of the first geometry using a curve smoothing algorithm, and in a transformation process, retain a point that is on the contour line, obtained after the moving, of the top surface and is at a distance shorter than a second distance threshold from the another plane constituting the body zone,
wherein when there is still a point that is beyond the body zone on the transformed contour line of the top surface of the first geometry, the first moving and the second performing steps are repeated until all points on the transformed contour line of the top surface of the first geometry are located within the body zone; and/or
wherein when the second geometry is beyond the body zone, the second geometry is processed using a processing method that is the same as that for the first geometry.

6. The method according to claim 5, wherein the first geometry intersects with the second geometry, and wherein an intersecting part is a three-dimensional zone.

7. The method according to claim 1, wherein processing the zones of the same type using the same processing method comprises:
for the end zone, using a zone enclosed by a section line of the end zone as a bottom surface, projecting the bottom surface in a direction perpendicular to the bottom surface onto another plane constituting the end zone, and finding a plane with a largest projection area;
projecting the bottom surface in a direction perpendicular to the plane with the largest projection area to obtain a projection contour line that is formed on the plane with the largest projection area by the bottom surface, connecting the projection contour line to the bottom surface to form a third geometry, and extracting a surface of the third geometry to generate a sub-curved surface located within the end zone, wherein the section line comprised in the zone is interpolated into the sub-curved surface; and
for the empty zone, skipping performing processing.

8. The method according to claim 7, wherein after connecting the projection contour line to the bottom surface to form the third geometry, the method further comprises extending the third geometry to the body zone and/or another end zone such that the third geometry intersects with a geometry within the body zone and/or the another end zone.

9. The method according to claim 1, wherein the method further comprises:
acquiring a newly input section line of the target object;
redividing the three-dimensional space into zones using a plane on which the newly input section line of the target object is located;
for a zone affected by the newly input section line of the target object, regenerating a sub-curved surface located within the affected zone, wherein a section line comprised in the affected zone is interpolated into the sub-curved surface; and
splicing sub-curved surfaces within all zones to obtain an updated curved surface model of the target object.

10. The method according to claim 1, wherein the section line is a closed plane curve, and wherein two section lines located on a same plane do not intersect.

11. The method according to claim 1, wherein for a first section line and a second section line that are respectively located on any two non-parallel planes, namely, a first plane and a second plane, an intersection point set of the first section line and the second plane is consistent with an intersection point set of the second section line and the first plane.

12. The method according to claim 1, wherein the curved surface model of the target object is a subdivision curved surface model or a triangle mesh curved surface model.

13. An apparatus for creating a curved surface model, comprising:
a memory comprising instructions; and
a processor coupled to the memory, wherein the instructions cause the processor to be configured to:
acquire an already input section line of a target object;
divide three-dimensional space into zones using a plane on which the already input section line of the target object is located;
generate, according to a shape of each zone and a section line comprised in each zone, a geometry located within each zone, wherein the section line comprised in each zone is interpolated into the surface of the geometry;
extract the surface of the geometry located within each zone to generate a sub-curved surface located within each zone, wherein a section line comprised in the zone where the sub-curved surface is located is interpolated into the sub-curved surface; and
splice the sub-curved surfaces to obtain a curved surface model of the target object;
determine a type of each zone after dividing the three-dimensional space into zones such that zones of a same type are processed using a same processing method;
determine that the type of each zone is a body zone when the section lines are comprised on two or more planes in all planes constituting a zone;
determine that the type of each zone is an end zone when a section line is comprised on only one plane in all planes constituting a zone; and
determine that the type of each zone is an empty zone when a section line is not comprised on any plane in all planes constituting a zone.

14. The apparatus according to claim 13, wherein when processing the body zone, the instructions further cause the processor to be configured to:
select any plane comprising a section line from the body zone;
use a zone enclosed by the section line within the plane as a bottom surface;
translate the bottom surface in a direction perpendicular to the bottom surface to generate a geometry whose top surface is in a same shape as the bottom surface, wherein the section line is interpolated into the surface of the geometry, a height of the geometry is $h_p = \delta * h_{ij}$, wherein $\delta \in (0,1)$, and $h_{ij}$ is a shortest distance between a center of the section line and a point at which a ray starting with the center of the section line and emitted in the direction perpendicular to the bottom surface intersects with another plane constituting the body zone;

successively generate a geometry into which the another section line is interpolated for another section line comprised in the body zone;

process a geometry that is beyond the body zone such that all geometries are located within the body zone; and solve a union set of all the geometries located within the body zone;

extract a surface of the union set; and use the surface as a sub-curved surface located within the body zone, and wherein a section line comprised in the body zone is interpolated into the sub-curved surface.

15. The apparatus according to claim 14, wherein the body zone comprises at least a first section line and a second section line, wherein the geometry that is located within the body zone comprises at least a first geometry and a second geometry, wherein the first section line is interpolated into a surface of the first geometry, wherein the second section line is interpolated into a surface of the second geometry, wherein the first section line does not intersect with the second section line, and wherein the instructions further cause the processor to be configured to:

when the first geometry and/or the second geometry are/is beyond the body zone, decrease a value of $\delta$ of the first geometry and/or a value of $\delta$ of the second geometry to adjust a height $h_p$ of the first geometry and/or a height $h_p$ of the second geometry such that the first geometry and/or the second geometry are/is located within the body zone; and/or move all points on a contour line of a top surface of the first geometry and/or the second geometry towards a center of the top surface until all the points on the contour line of the top surface are located within the body zone.

16. The apparatus according to claim 14, wherein the body zone comprises at least a first section line and a second section line, wherein the geometry that is located within the body zone comprises at least a first geometry and a second geometry, wherein the first section line is interpolated into a surface of the first geometry, wherein the second section line is interpolated into a surface of the second geometry, wherein the first section line intersects with the second section line, wherein a point that is on a contour line of a top surface of the first geometry corresponds to a point preset on the first section line is located within the body zone, and wherein the point preset on the first section line is a point at a distance shorter than a first distance threshold from a plane on which the second section line is located.

17. The apparatus according to claim 16, wherein the instructions further cause the processor to be configured to:

move a point that is on the contour line of the top surface of the first geometry and is beyond the body zone into the body zone;

perform transformation on a contour line, obtained after the moving, of the top surface of the first geometry using a curve smoothing algorithm, and in a transformation process, retain a point that is on the contour line, obtained after the moving, of the top surface and is at a distance shorter than a second distance threshold from the another plane constituting the body zone;

continue processing the first geometry until all points on the transformed contour line of the top surface of the first geometry are located within the body zone after a point that is beyond the body zone on the transformed contour line of the top surface of the first geometry; and process the second geometry using a processing method that is the same as that for the first geometry when the second geometry is beyond the body zone.

18. The apparatus according to claim 17, wherein the first geometry intersects with the second geometry, and wherein an intersecting part is a three-dimensional zone.

19. The apparatus according to claim 13, wherein when processing the end zone, the instructions further cause the processor to be configured to:

use a zone enclosed by a section line of the end zone as a bottom surface;

project the bottom surface in a direction perpendicular to the bottom surface onto another plane constituting the end zone;

find a plane with a largest projection area;

project the bottom surface in a direction perpendicular to the plane with the largest projection area to obtain a projection contour line that is formed on the plane with the largest projection area by the bottom surface;

an end processing unit configured to connect the projection contour line to the bottom surface to form a third geometry; and extract a surface of the third geometry to generate a sub-curved surface located within the end zone, wherein the section line comprised in the zone is interpolated into the sub-curved surface, and wherein for the empty zone, the processor skips performing processing.

20. The apparatus according to claim 19, wherein the instructions further cause the processor to be configured to, after connecting the projection contour line to the bottom surface to form the third geometry, extend the third geometry to the body zone and/or another end zone such that the third geometry intersects with a geometry within the body zone and/or the another end zone.

21. The apparatus according to claim 13, wherein the instructions further cause the processor to be configured to:

acquire a newly input section line of the target object;

redivide the three-dimensional space into zones using a plane on which the newly input section line of the target object is located;

regenerate a sub-curved surface located within the affected zone for a zone affected by the newly input section line of the target object, wherein a section line comprised in the affected zone is interpolated into the sub-curved surface; and splice sub-curved surfaces within all zones to obtain an updated curved surface model of the target object.

22. The apparatus according to claim 13, wherein the section line is a closed plane curve, and wherein two section lines located on a same plane do not intersect.

23. The apparatus according to claim 13, wherein for a first section line and a second section line that are respectively located on any two non-parallel planes, namely, a first plane and a second plane, an intersection point set of the first section line and the second plane is consistent with an intersection point set of the second section line and the first plane.

24. The apparatus according to claim 13, wherein the curved surface model of the target object is a subdivision curved surface model or a triangle mesh curved surface model.

* * * * *